(12) United States Patent
Ohsawa et al.

(10) Patent No.: US 7,622,200 B2
(45) Date of Patent: Nov. 24, 2009

(54) LIGHT EMITTING ELEMENT

(75) Inventors: Nobuharu Ohsawa, Kanagawa (JP); Hiroko Abe, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 46 days.

(21) Appl. No.: 11/132,061

(22) Filed: May 18, 2005

(65) Prior Publication Data
US 2006/0011908 A1    Jan. 19, 2006

(30) Foreign Application Priority Data
May 21, 2004    (JP)    ............................. 2004-152566

(51) Int. Cl.
  *B32B 9/00*    (2006.01)
  *B32B 19/00*    (2006.01)
(52) U.S. Cl. .................. 428/690; 428/917; 428/212; 257/40; 313/504; 313/506
(58) Field of Classification Search .............. 257/40, 257/E25.008, E25.009; 313/504, 506; 428/690, 428/917, 212
See application file for complete search history.

(56) References Cited

U.S. PATENT DOCUMENTS

| | | | | |
|---|---|---|---|---|
| 5,834,130 | A | 11/1998 | Kido | ............................ 428/690 |
| 5,869,199 | A | 2/1999 | Kido | ............................ 428/690 |
| 5,989,737 | A | 11/1999 | Xie et al. | ..................... 428/690 |
| 6,251,531 | B1 * | 6/2001 | Enokida et al. | ............. 428/690 |
| 6,285,039 | B1 | 9/2001 | Kobori et al. | ................. 257/40 |
| 6,387,546 | B1 | 5/2002 | Hamada et al. | ............. 428/690 |
| 6,603,140 | B2 | 8/2003 | Kobori et al. | ................. 257/40 |
| 6,706,423 | B2 * | 3/2004 | Lin et al. | ..................... 428/690 |
| 6,967,062 | B2 * | 11/2005 | Hatwar et al. | ............... 428/690 |
| 7,053,402 | B2 | 5/2006 | Yoshitomi et al. | |
| 7,070,867 | B2 * | 7/2006 | Thompson et al. | .......... 428/690 |

(Continued)

FOREIGN PATENT DOCUMENTS

CN    1422104 A    6/2003

(Continued)

OTHER PUBLICATIONS

Tang, C.W. et al, "Organic Electroluminescent Diodes," Applied Physics Letters, vol. 51, No. 12, pp. 913-915, Sep. 21, (1987).

(Continued)

*Primary Examiner*—Kenneth A Parker
*Assistant Examiner*—Joseph Nguyen
(74) *Attorney, Agent, or Firm*—Cook Alex Ltd.

(57) ABSTRACT

The present invention relates to a thin film light emitting element which has low drive voltage. In particular, the present invention relates to a thin film light emitting element which has low drive voltage and in which color purity and luminous efficiency are not deteriorated. A structure of a light emitting element of the present invention comprises at least an electron transporting layer, a light emitting layer containing a luminescent substance, a first region, and a second region are provided between electrodes, wherein the electron transporting layer includes the second region between the light emitting layer and the first region, the first region includes a substance containing a polycyclic condensed ring, and the second region does not include the substance containing a polycyclic condensed ring.

27 Claims, 17 Drawing Sheets

U.S. PATENT DOCUMENTS

| | | |
|---|---|---|
| 7,141,817 B2 | 11/2006 | Nishi et al. |
| 7,372,076 B2 | 5/2008 | Nishi et al. |
| 2002/0038867 A1 | 4/2002 | Kobori et al. ............ 257/40 |
| 2002/0071963 A1* | 6/2002 | Fujii ...................... 428/690 |
| 2002/0113546 A1* | 8/2002 | Seo et al. ............... 313/504 |
| 2003/0038287 A1* | 2/2003 | Suzuki et al. ............ 257/40 |
| 2003/0228487 A1* | 12/2003 | Lin ......................... 428/690 |
| 2005/0038296 A1* | 2/2005 | Hosokawa et al. ...... 564/426 |
| 2005/0064235 A1* | 3/2005 | Liao et al. ............... 428/690 |
| 2008/0278069 A1 | 11/2008 | Nishi et al. |

FOREIGN PATENT DOCUMENTS

| | | |
|---|---|---|
| EP | 0 647 694 | 10/1994 |
| EP | 0 647 694 | 4/1995 |
| EP | 0 712 916 | 5/1996 |
| JP | 07 041759 | 2/1995 |
| JP | 10 255985 | 9/1998 |
| JP | 2000-164362 | 6/2000 |
| JP | 2000-243574 | 9/2000 |
| JP | 2002-324673 | 11/2002 |
| JP | 2003-077676 | 3/2003 |
| WO | WO 9808360 | 2/1998 |

OTHER PUBLICATIONS

Tang, C.W. et al, "Electroluminescence of Doped Organic Thin Films," Journal of Applied Physics, vol. 65, No. 9, pp. 3610-3616, May 1, (1989).

C. Adachi et al., "Electroluminescence in Organic Films With Three-Layer Structure", Japanese Journal Of Applied Physics, vol. 27, No. 2, p. L269-L271 (Feb. 1988).

C.W. Tang, "Electroluminescence of Doped Organic Thin Films", J. Appl. Phys. 65(9), p. 3610-3616 (May 1989).

H. Aziz et al., "Study of Organic Light Emitting Devices With A 5, 6, 11, 12-tetraphenylnaphthacene (rubene) -doped hole transport layer", Applied Physics Letter, vol. 80, No. 12, p. 2180-2182.

Office Action re Chinese application No. CN 200510073907.1, dated Oct. 10, 2008 (with English translation).

* cited by examiner

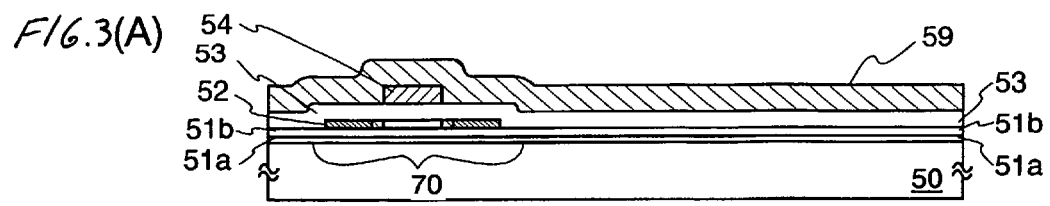
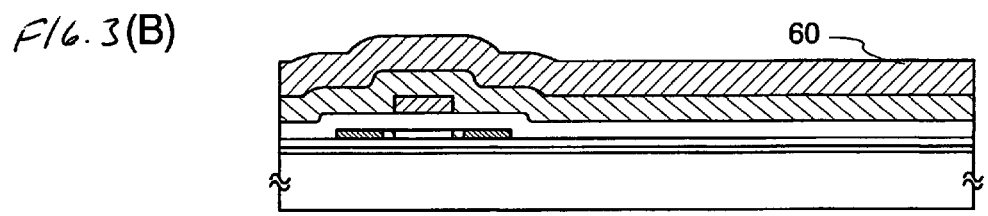
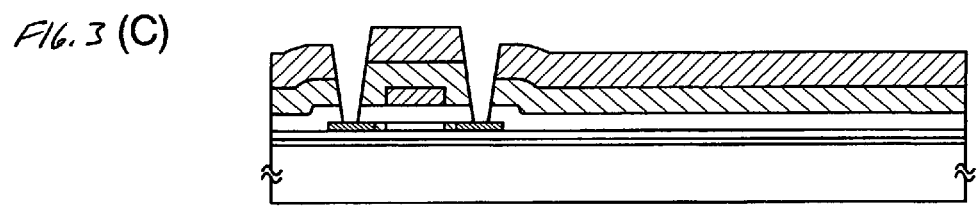
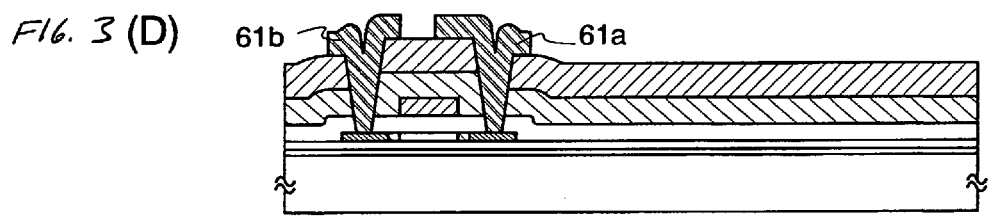
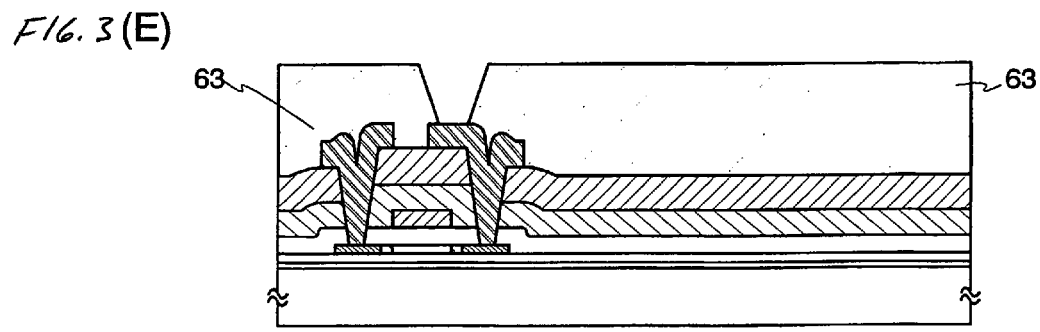

LIGHT EMITTING ELEMENT

TECHNICAL FIELD

The present invention relates to a light emitting element; more particularly, a structure of a light emitting element which can be driven at comparatively lower drive voltage.

BACKGROUND OF THE INVENTION

A display has been actively developed, in which a self-light emitting type thin film light emitting element that emits light by itself by applying current thereto is used.

In the thin film light emitting element, an electrode is connected to a single layer- or multilayer-thin film that is formed by using an organic compound, inorganic compound or both thereof, and current is applied, so that light is emitted. As for the thin film light emitting element, lower power consumption, space-saving and visibility are expected. Moreover, the market is also expected to be expanded in the future.

Among them, as for the light emitting element that has a multilayer structure, it has become possible to form an element that can emit light efficiently by separating functions per layer as compared with the conventional one (see C. W Tan, et al., Applied Physics. Letters, Vol. 51, No. 12, 913-915 (1987), for example).

A thin film light emitting element that has a multilayer structure includes a light-emitting lamination body that is interposed between an anode and a cathode, and the light-emitting lamination body is formed by a hole injecting layer, a hole transporting layer, a light-emitting layer, an electron transporting layer, an electron injecting layer or the like. Not all of the hole injecting layer, the hole transporting layer, the electron transporting layer and the electron injecting layer may be provided, depending on the element structure. In addition, the hole transporting layer and the electron transporting layer sometimes serve as the light-emitting layer. In this case, a method of doping a highly carrier transporting-electron transporting layer or hole transporting layer with a pigment that has high luminous efficiency is used. By employing this method, a material that has high luminous efficiency but lower carrier transporting property can be used as a luminescent substance (see C. W. Tan et al., Journal of Applied Physics, Vol. 65, No. 9, 3710-3716 (1989), for example).

Luminescence is obtained by applying current to the thin film light emitting element, and there exists proportionality between luminance of the luminescence and the current that is applied. That is to say, large current has to be applied to obtain high luminance. Therefore, it is attempted that current be applied easily and drive voltage be reduced by doping at least a part of thin films that are laminated between the electrodes of the light emitting element with additives. In addition, in this case, comparatively low voltage is necessary to obtain the same luminance; thus, deterioration of the thin film light emitting element is suppressed (see Japanese Patent Application Laid-Open No: 2003-77676, for example).

In JP '676, a substance containing a polycyclic condensed ring such as diphenylanthracene or rubrene in which its carrier transporting property is relatively favorable is used as an additive. Advantages such as lower drive voltage are obtained by doping the electron transporting layer with the substance mentioned above.

However, the substances containing a polycyclic condensed ring that are preferably used as an additive usually emit light by themselves. Therefore, when an energy gap of a luminescent substance in the light emitting layer is larger than that of the additive, energy of the excited luminescent substance is transferred to the additives that are added into the electron transporting layer; thus, the additives can also be excited to emit light. In addition, luminous efficiency can be lowered by energy transfer even when the additives do not emit light.

As described above, when a substance emitting light exists in addition to the luminescent substance in the light emitting layer, color purity is deteriorated, which is not preferable. Therefore, when additives are used, the additives that have a larger energy gap than that of the luminescent substance in the light emitting layer are usually used. In Embodiment 1 of JP '676, diphenylanthracene that has a larger energy gap than that of rubrene added as a luminescent substance in a light emitting layer is used as an additive.

In the case of a luminescent substance that emits red light, additives that fulfill the requirements are easily selected since it has a small energy gap. However, when luminescence from a luminescent substance that has a larger energy gap is required, choices are more and more limited in the current situation. For reference, the rubrene shows favorable electron injecting property and electron transporting property by doping the electron injecting layer and the electron transporting layer with the appropriate amount thereof. However, the luminescent color is yellow so that rubrene is not preferably used for the light emitting element that has the light emitting layer using the luminescent substance having a larger energy gap than that of rubrene (it can be thought to be a substance that emits from green light to purple light).

It is an object of the present invention to provide a thin film light emitting element in which drive voltage is low. In addition, it is also an object of the present invention to provide a thin film light emitting element which has a structure of low drive voltage and in which color purity and luminous efficiency are not deteriorated.

SUMMARY OF THE INVENTION

In one structure of a thin film light emitting element to solve the problems as described above, an electron transporting layer, a light emitting layer containing a luminescent substance, a first region and a second region are at least provided between electrodes, wherein the electron transporting layer includes the second region between the light emitting layer and the first region. It is a feature that the first region includes a substance containing a polycyclic condensed ring and the second region does not include the substance containing a polycyclic condensed ring.

In another structure, an electron transporting layer, a light emitting layer containing a luminescent substance, a first region and a second region are at least provided between electrodes, wherein the electron transporting layer includes the second region between the light emitting layer and the first region. It is a feature that the concentration of the substance containing a polycyclic condensed ring in the first region is higher than that in the second region.

In another structure, an electron transporting layer, a light emitting layer containing a luminescent substance, a first region and a second region are at least provided between electrodes, wherein the electron transporting layer includes the second region between the light emitting layer and the first region. It is a feature that a substance containing a polycyclic condensed ring is selectively added into the first region.

A thin film light emitting element in which drive voltage is low can be provided by using a structure according to the present invention. In addition, a thin film light emitting element that has a structure of low drive voltage can be provided, in which deterioration of color purity and luminous efficiency is suppressed.

BRIEF DESCRIPTION OF THE DRAWINGS

FIGS. 3(A)-3(E) are diagrams illustrating manufacturing steps of a thin film light emitting element according to the present invention.

DETAILED DESCRIPTION OF THE INVENTION

Hereinafter, embodiment mode of the present invention will be described with reference to accompanying drawings. It is to be noted that the present invention can be applied in many various modes, and various changes in the embodiment mode and details thereof will be apparent to those skilled in the art unless such changes depart from the spirit and scope of the invention. Therefore, the present invention should not be interpreted as being limited to what is described in the embodiment mode.

Embodiment Mode 1

Figure 1A:
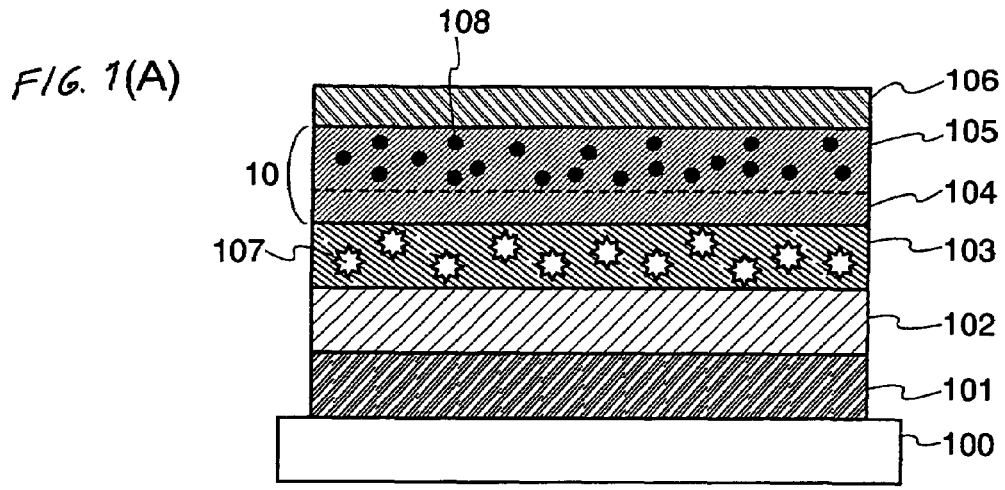
FIGS. 1(A)-1(C) are diagrams illustrating a structure of a thin film light emitting element according to the present invention.

FIG. 1(A) shows one example of a structure of a thin film light emitting element according to the present invention. A thin film light emitting element according to the present embodiment mode includes an anode 101, a hole transporting layer 102, a light emitting layer 103 containing luminescent substances 107, an electron transporting layer 10 and a cathode 106 that are formed over an insulating surface of a substrate 100 or the like. The electron transporting layer 10 is divided into two layer regions, and at least one common electron transporting material is used in the two regions. Of the two regions, a first region 105 that is closer to the cathode 106 is doped with additives 108 in addition to the electron transporting material to improve the electron transporting property, the electron injecting property or both thereof, whereas a second region 104 that is closer to the light emitting layer 103 is not doped with the additives 108.

It is to be noted that the first region 105 is doped with the additives 108 at various rates. In the present invention, regarding a host material of the first region, an electron transporting material that is common to the first region and the second region is regarded as a host material of the first region. The rate of the additives 108 in the first region 105 may be 1 wt % or more. As a structure of the first region, there is also a case in which the rate of the additives 108 is 100 wt %, in other words, the first region is formed with only the additives 108. In addition, when the first region is formed with only the additives 108, a host material is to be a material that forms the second region.

Figure 1B:
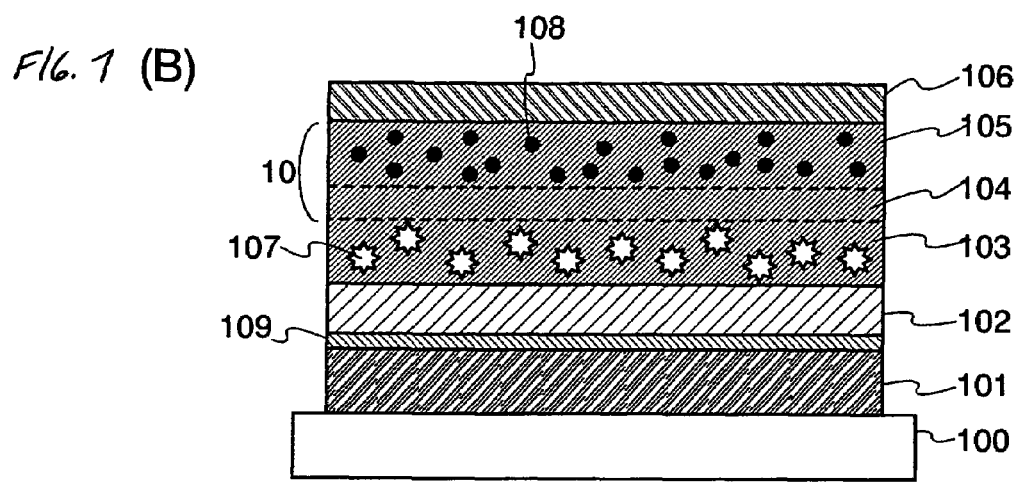
Figure 1C:
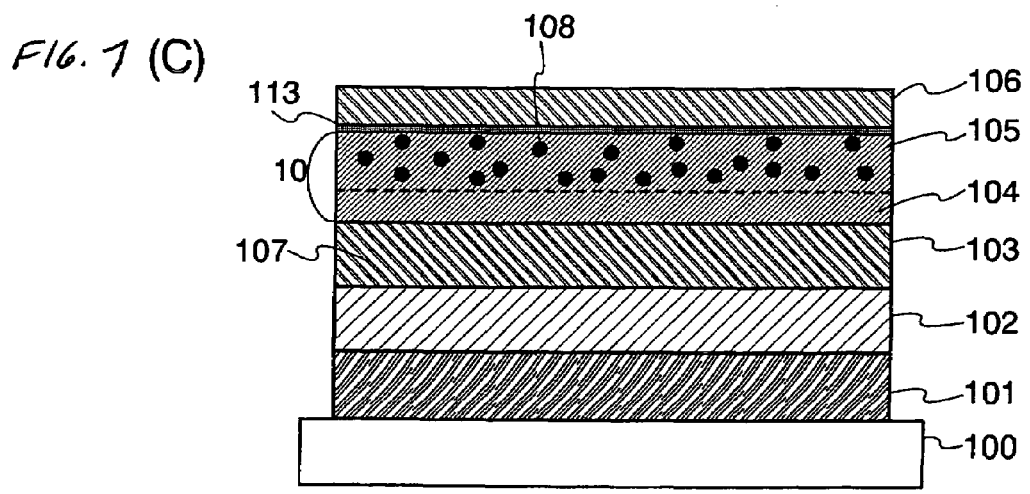

Moreover, a host material of the light emitting layer 103 is to be a material that has the largest constituent rate of a substance forming the light emitting layer 103. The host material of the light emitting layer 103 may be the same material as a host material of the electron transporting layer 10 as shown in FIG. 1(B), or a different host material as shown in FIG. 1(A). Further, as shown in FIG. 1(C), the light emitting layer 103 may have a structure in which the light emitting layer itself is formed of luminescent substances 107 and the light emitting layer 103 emits light by itself.

As a host material that can be used for the electron transporting layer 10, a metal complex that has a quinoline skeleton or a benzoquinoline skeleton such as tris(8-quinolinolato) aluminum (Abbreviation: $Alq_3$); tris(4-methyl-8-quinolinolato) aluminum (Abbreviation: $Almq_3$); bis(10-hydroxybenzo[h]-quinolinato) beryllium (Abbreviation: $BeBq_2$); and bis(2-methyl-8-quinolinolato)(4-phenylphenolato)aluminum (Abbreviation: BAlq); or the like can be used. As a host material for the light emitting layer 103, an aromatic compound such as 9,10-diphenylanthracene; 9,10-di(2-naphthyl)anthracene; 2-t-butyl-9,10-bis[2-(naphthyl)phenyl]anthracene; 2-t-butyl-9,10-bis[2-(phenyl)phenyl]anthracene; and 4,4'(2,2-diphenylvinyl)biphenyl is preferably used. Alternatively, a typical metal complex such as bis(2-methyl-8-quinolinonato)-(4-hydroxy-biphenyl)-aluminum may also be used. As a material that can be commonly used for the electron transporting layer 10 and the light emitting layer 103, a metal complex that has a quinoline skeleton or a benzoquinoline skeleton such as tris(8-quinolinolato) aluminum (Abbreviation: $Alq_3$); tris(4-methyl-8-quinolinolato) aluminum (Abbreviation: $Almq_3$); bis(10-hydroxybenzo[h]-quinolinato) beryllium (Abbreviation: $BeBq_2$); and bis(2-methyl-8-quinolinolato)(4-phenylphenolato)aluminum (Abbreviation: BAlq); or the like can be used. As the luminescent substance 107 that is added into the materials and becomes the luminescence center, 4-dicyanomethylene-2-methyl-6-[2-(1,1,7,7-tetramethyljulolidine-9-yl)-ethenyl]-4H-pyr an (Abbreviation: DCJT); 4-dicyanomethylene-2-t-butyl-6-[2-(1,1,7,7-tetramethyljulolidine-9-yl)ethenyl]-4H-pyra n (Abbreviation: DCJTB); periflanthene; 2,5-dicyano-1,4-bis[2-(10-methoxy-1,1,7,7-tetramethyljulolidine-9-yl) ethenyl]benzene; N,N'-dimethylquinacridon (Abbreviation: DMQd); coumarin6; coumarin545T; tris(8-quinolinolate) aluminum (abbreviation: $Alq_3$); 9,9'-bianthryl; 9, 10-diphenylanthracene (Abbreviation: DPA); 9,10-bis(2-naphthyl)anthracene (Abbreviation: DNA); 2,5,8,11-tetra-t-butylperyrene (Abbreviation: TBP); or the like is given. In addition, as a material that can form the light emitting layer 103 using only the luminescent substance 107, tris(8-quinolinolato) aluminum (Abbreviation: $Alq_3$); 9,10-bis(2-naphthyl)anthracene (Abbreviation: DNA); bis(2-methyl-8-quinolinolato)(4-phenylphenolato)aluminum (Abbreviation: BAlq); or the like is given.

Substances containing a polycyclic condensed ring may be used for the additives 108 that are added into the first region of the electron transporting layer; in particular, a substance is selected, in which either electron injecting property or electron transporting property is higher than that in the host material of the first region. In addition, both of electron injecting property and electron transporting property of the substance are preferably high. It is to be noted that a highly electron injecting material means a material in which an LUMO level is lower than that in a material which mainly forms the first region. Specifically, rubrene, 9,10-diphenylanthracene, pentacene, perylene, and derivatives thereof can be used.

In the thin film light emitting element according to the present invention that has the structure as described above, electron injecting property, electron transporting property, or both thereof are improved by the additives 108 that are added into the first region. Therefore, a thin film light emitting element can be provided, in which current flows easily, and drive voltage is low as a result.

In addition, since the second region 104 which is not doped with the additives 108 is formed in the electron transporting layer, the luminescent substances 107 in the light emitting layer 103 and the additives 108 are separated to have the distance of at least equal to or more than the film thickness of the second region 104. Energy transfer efficiency between excited species is considered to become smaller in proportion to the sixth power of the distance; therefore, energy transfer from the excited luminescent substances 107 to the additives 108 is considered to be significantly suppressed and luminescence from the additives 108 can be reduced remarkably.

Moreover, even when light is not emitted from the additives 108, energy is transferred from the excited luminescent substances 107 to the additives 108 so that the luminescent substances 107 are deactivated not to emit light, which emits light usually, and there is also a case where current efficiency is lowered. Also in this case, by using a light emitting element that has a structure according to the present invention, energy transfer from the luminescent substances 107 to the additives 108 is significantly reduced so that luminous efficiency can be prevented from decreasing. Therefore, the thin film light emitting element according to the present invention can be a thin film light emitting element that has very favorable color purity, since luminescence other than objected luminescence from the luminescent substances 107 can be significantly reduced.

It is to be noted that the film thickness of the second region 104 is desired to be 5 nm or more, preferably 10 nm or more, since it is a distance which can sufficiently suppress energy transfer between excited species.

Moreover, according to the structure of the thin film light emitting element of the present invention, energy transfer between excited species can be significantly reduced so that the thin film light emitting element can be used without deteriorating color purity and luminous efficiency even when an energy gap of the additives 108 that are added into the first region of the electron transporting layer is smaller than an energy gap of the luminescent substances 107. Therefore, no more difference is generated in selecting additives that are added into the electron transporting layer, depending on size of the energy gap of the luminescent substances that are added into the light emitting layer; thus, a substance in which electron injecting property, electron transport property or both thereof are favorable can be used as the additives 108 independently of the luminescent color.

In addition, in a case where light that is emitted from the luminescent substances 107 is phosphorescence, energy is sometimes transferred to the additives 108 even when the energy gap of the additives 108 is smaller than the energy gap of the luminescent substances 107. Also in such a case, according to the structure of the thin film light emitting element of the present invention, energy transfer from the luminescent substances 107 to the additives 108 is suppressed; thus, deterioration in color purity or luminous efficiency can be prevented.

It is to be noted that a hole-injecting layer 109 is formed over an anode 101 in FIG. 1(B). The hole-injecting layer 109 may be formed like this, or is not needed to be formed as shown in FIGS. 1(A) and 1(C). In addition, an electron injecting layer 113 may be provided as shown in FIG. 1(C). Moreover, both of a hole-injecting layer and an electron injecting layer may be provided.

The structures of the light emitting element as described in the present embodiment mode can be appropriately combined to be used.

Figure 2:
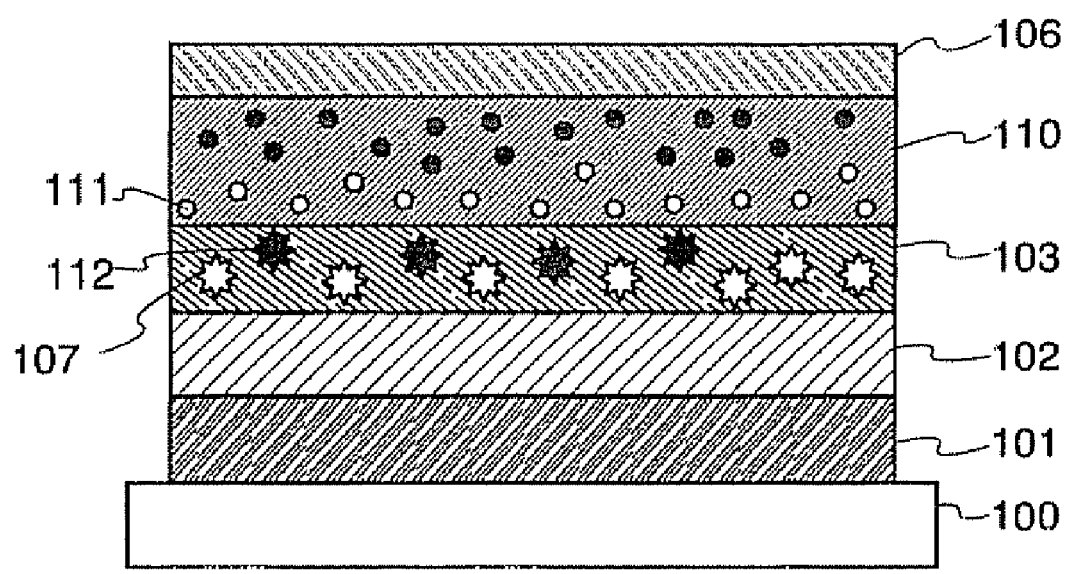
FIG. 2 is a diagram illustrating a structure of a conventional thin film light emitting element.

FIG. 2 shows an example of a conventional thin film light emitting element. The thin film light emitting element of FIG. 2 does not have the structure corresponding to the second region in the present invention, and the distance between additives in an electron transporting layer 110 and luminescent substances in a light emitting layer 103 is short. Therefore, energy is transferred from excited luminescent substances 112 to the additives 111 that are included in the electron transporting layer, and a part thereof emits light. Thus, light to be emitted outside is combined light of light that is emitted from the luminescent substances 107 and light that is emitted from the additives 111, thereby deteriorating color purity. Moreover, according to the structure as described above, luminous efficiency is lowered even when the additives 111 to which energy is transferred from the luminescent substances 112 do not emit light.

Embodiment Mode 2

Figure 4A:
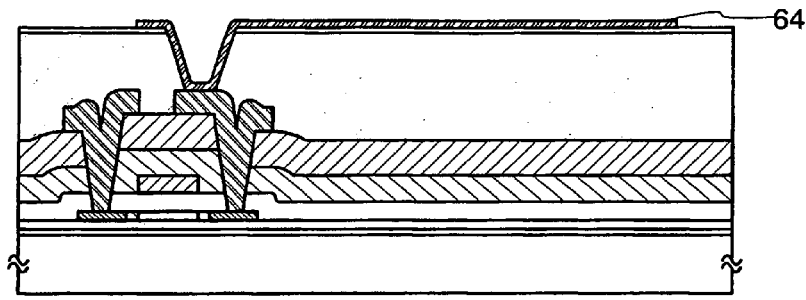
FIGS. 4(A)-4(C) are diagrams illustrating manufacturing steps of a thin film light emitting element according to the present invention.
Figure 4B:
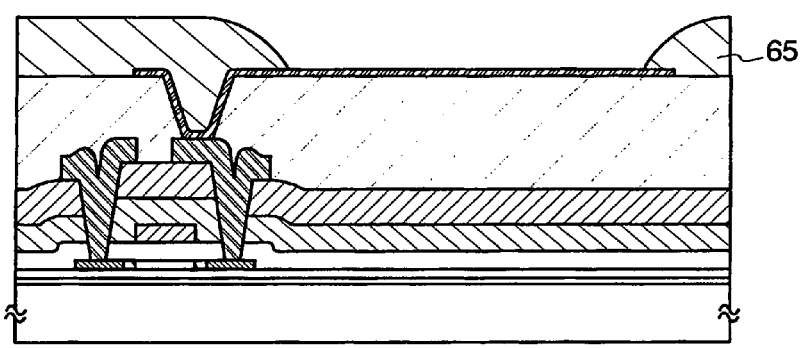
Figure 4C:
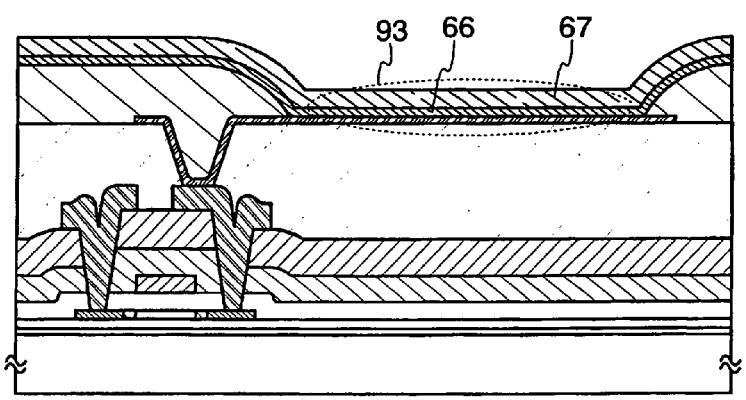

In the present embodiment mode, a method for manufacturing a display device according to the present invention will be described with reference to FIGS. 3 and 4. It is to be noted that an example of manufacturing an active matrix type display device is described in the present embodiment mode; however, a thin film light emitting element according to the present invention can also be applied to a passive matrix type display device as a matter of course.

First, after a first base insulating layer 51a and a second base insulating layer 51b are formed over a substrate 50, a semiconductor layer is fuirther formed over the second base insulating layer 51b. (FIG. 3(A))

As a material for the substrate 50, glass, quartz, plastic (polyimide, acryl, polyethylene terephthalate, polycarbonate, polyacrylate, polyethersulfone and the like) and the like that have light-transmitting property can be used. These substrates may be polished to be used by CMP or the like if necessary. A glass substrate is used in the present embodiment mode.

The first base insulating layer 51a and the second base insulating layer 51b are provided in order to prevent an element, which influences characteristics of the semiconductor film adversely; such as an alkali metal and an alkaline earth metal, in the substrate 50 from diffusing into the semiconductor layer. As a material, silicon oxide, silicon nitride, silicon oxide containing nitrogen, silicon nitride containing oxygen or the like can be used. In the present embodiment mode, the first base insulating layer 51a is formed by silicon nitride and the second base insulating layer 51b is formed by silicon oxide. In the present embodiment mode, the base insulating layer is formed by using two layers, namely, the first base insulating layer 51a and the second base insulating layer 51b; however, the base insulating layer may be formed. as a single layer or multi-layer of two or more layers. In addition, the base insulating layer is not necessarily provided when there is no concern about diffusion of impurities from a substrate.

The semiconductor layer that is formed thereafter is obtained by crystallizing an amorphous silicon film by laser in the present embodiment mode. An amorphous silicon film is formed with a thickness of 25 to 100 nm (preferably, 30 to 60 nm) over the second base insulating layer 51b. As the method for manufacturing, a known method such as a sputtering method, a low-pressure CVD method and a plasma CVD method can be employed. After that, heat treatment is performed at 500° C. for one hour to dehydrogenate.

Subsequently, a crystalline silicon film is formed by crystallizing the amorphous silicon film with the use of a laser irradiation apparatus. In the present embodiment mode, an excimer laser is used in laser crystallization. A laser beam that is emitted is processed into a linear beam spot shape by using an optical system. Then, the amorphous silicon film is irradiated with the laser beam so that tit becomes a crystalline silicon film to be used as the semiconductor layer.

As another crystallization method for the amorphous silicon film, a method by which crystallization is conducted only by heat treatment or a method by which crystallization is conducted by conducting heat treatment using a catalyst element that promotes crystallization is given. As the element that promotes crystallization, nickel, iron, palladium, tin, lead, cobalt, platinum, copper, gold and the like are given. A glass substrate or the like is less damaged by using these elements since crystallization is conducted at a lower temperature and in a shorter time as compared with the case of conducting crystallization only by heat treatment. When crystallization is conducted only by heat treatment, the substrate 50 may be a quartz substrate that is resistant to heat.

Subsequently, a slight amount of impurities are added, namely, channel doping is performed to the semiconductor layer if necessary so that the threshold value can be controlled. N-type or P-type impurities (phosphorus or boron) are added by an ion doping method or the like in order to obtain the desired threshold value.

After that, as shown in FIG. 3(A), the semiconductor layer is patterned into a predetermined shape to obtain an island-shaped semiconductor layer 52. Patterning is performed as follows: The semiconductor layer is coated with a resist mask, exposed with a predetermined mask shape and baked to form a photoresist on the semiconductor layer, and etching is performed by using this mask.

Next, a gate insulating layer 53 is formed to cover the semiconductor layer 52. The gate insulating layer 53 is formed by using an insulating layer containing silicon with a thickness of 40 to 150 nm by a plasma CVD method or a sputtering method. Silicon oxide is used in the present embodiment mode.

Then, a gate electrode 54 is formed over the gate insulating layer 53. The gate electrode 54 may be formed by using an element selected from Ta, W, Ti, Mo, Al, Cu, Cr and Nd, or an alloy material or a compound material mainly containing the element. In addition, a semiconductor film typified by a poly-crystalline silicon film which is doped with an impurity element such as phosphorus may also be used. Moreover, AgPdCu alloy may be used.

In the present embodiment mode, the gate electrode 54 is formed as a single layer; however, the gate electrode 54 may have a laminated structure of two ore more layers, for example, the structure that has tungsten as a lower layer and molybdenum as an upper layer. Even when the gate electrode is formed to have a laminated structure, materials as described above may be used and a combination thereof may be appropriately selected.

The gate electrode 54 is processed by etching with the use of a mask using a photoresist.

Subsequently, highly concentrated impurities are added into the semiconductor layer 52 using the gate electrode 54 as a mask. Then, a thin film transistor 70 including the semiconductor layer 52, the gate insulating layer 53 and the gate electrode 54 can be formed.

It is to be noted that a process for manufacturing a thin film transistor is not particularly limited and can be appropriately changed in order to manufacture a transistor to have a desired structure.

In the present embodiment mode, a top gate thin film transistor is used, in which a crystalline silicon film that is crystallized by laser crystallization is used; however, a bottom gate thin film transistor using an amorphous semiconductor film can also be used for a pixel portion. As the amorphous semiconductor, not only silicon but silicon germanium can also be used. When silicon germanium is used, the concentration of germanium is preferably about 0.01 to 4.5 atomic %.

In addition, a microcrystalline semiconductor film (semiamorphous semiconductor) may also be used, in which a crystal grain of 0.5 nm to 20 nm can be observed in the amorphous semiconductor. Moreover, a micro crystal in which a crystal grain of 0.5 nm to 20 nm can be observed is referred to as a so-called microcrystal (μc).

Semiamorphous silicon that is a semiamorphous semiconductor (also referred to as SAS) can be obtained by grow discharge decomposition of a silicide gas. SiH4 is a typical silicide gas, and additionally, $Si_2H_6$, $SiH_2Cl_2$, $SiHCl_3$, $SiCl_4$, $SiF_4$ or the like can also be used. SAS is easily formed by using the silicide gas that is diluted by one or plurality of rare gas elements that are selected from hydrogen, hydrogen and helium, argon, krypton and neon. The silicide gas is preferably diluted in a range of a 10-fold to 1000-fold dilution factor. Reaction production of a coating film by grow discharge decomposition may be conducted under pressure in a range of 0.1 Pa to 133 Pa. High-frequency power of 1 MHz to 120 MHz, preferably 13 MHz to 60 MHz may be supplied to provide grow discharge. Temperature for heating the substrate is preferably 300 degrees or less, and temperature of 100 to 250 degrees for heating the substrate is suitable.

In SAS that is formed as described, Raman spectrum is shifted to a lower wave number side than 520 $cm^{-1}$, and diffraction peaks of (111) and (220) derived from a Si crystal lattice are observed in X-ray diffraction. At least 1 atom % or more of hydrogen or halogen is contained for terminating a dangling bond. As an impurity element in the film, impurities of the air component such as oxygen, nitrogen and carbon are expected to be contained at a rate of $1×10^{20}$ $cm^{-1}$ or less. In particular, oxygen concentration is $5×10^{19}/cm^3$ or less, preferably, $1×10^{19}/cm^3$ or less, and μ=1~10 $cm^2$/Vsec when the SAS is used in a TFT.

This SAS may be further crystallized by laser.

Then, an insulating film (hydrogenated film) 59 is formed using silicon nitride to cover the gate electrode 54 and the gate insulating layer 53. When the insulating film (hydrogenated film) 59 is formed, heat treatment is performed at 480° C. for about one hour so that an impurity element is activated and the semiconductor layer 52 is hydrogenated.

Then, a first interlayer insulating layer 60 is formed to cover the insulating film (hydrogenated film) 59. As a material to form the first interlayer insulating layer 60, silicon oxide, acryl, polyimide, siloxane, an Iow-k material or the like may be used. In the present embodiment mode, a silicon oxide film is formed as the first interlayer insulating layer. It is to be noted that siloxane is formed by a skeleton structure of bond of silicon (Si) and oxygen (0) and includes an organic group (such as an alkyl group, an aryl group) containing at least hydrogen as a substituent. As a substituent which siloxane has, fluorine may be given, or both of a group containing hydrogen and fluorine may also be given. (FIG. 3(B))

Next, contact holes that reach the semiconductor layer 52 are formed. The contact holes are formed by performing etching until the semiconductor layer 52 is exposed by using a resist mask, and either of wet etching or dry etching may be used. It is to be noted that etching may be performed one time or etching may be performed plural times depending on the conditions. When etching is performed plural times, both of wet etching and dry etching may be used. (FIG. 3(C))

Then, a conductive layer is formed to cover the contact holes or the first interlayer insulating layer 60. The conductive layer is processed into an expected shape to form a connection portion 61a, a wiring 61b and the like. This wiring may be a single layer of aluminum, copper or the like; however, in the present embodiment mode, the wiring has a laminated structure of molybdenum, aluminum and molybdenum from the substrate side. A laminated wiring may also have a structure of titanium, aluminum, titanium, titanium nitride, aluminum and titanium from the substrate side. (FIG. 3(D))

After that, a second interlayer insulating layer 63 is formed to cover the connection portion 61a, the wiring 6lb and the first interlayer insulating layer 60. As a material for the second interlayer insulating layer 63, a coated film made of acryl, polyimide and siloxane or the like that have self-planarization property can be preferably used. In the present embodiment mode, siloxane is used as the second interlayer insulating layer 63. (FIG. 3(E))

An insulating layer may be formed by using silicon nitride or the like over the second interlayer insulating layer 63 successively. The insulating layer is formed so that the second interlayer insulating layer 63 is prevented from being etched too much when a pixel electrode is etched later. Therefore, the insulating layer may not be particularly provided when the ratio of etching rates of the pixel electrode and the second interlayer insulating layer is large. Then, a contact hole that passes through the second interlayer insulating layer 63 and reach the connection portion 61a is formed.

A conductive layer having light transmitting property is formed to cover the contact holes and the second interlayer insulating layer 63 (or the insulating layer). Thereafter, the conductive layer having light transmitting property is processed into an anode 64 (a first electrode) of a thin film light emitting element. Here, the anode 64 (the first electrode) is in electrical contact with the connection portion 61a. As a material for the anode 64 (the first electrode), indium tin oxide (ITO), ITO containing silicon oxide (ITSO: Indium Tin Silicon Oxide), IZO (Indium Zinc Oxide) that is indium oxide containing zinc oxide at 2 to 20%, zinc oxide itself, GZO (Gallium Zinc Oxide) that is zinc oxide containing gallium, and the like may be used. In the present embodiment mode, ITSO is used as the anode 64 (the first electrode). (FIG. 4(A))

Next, an insulating layer that is formed from an organic material or an inorganic material is formed to cover the second interlayer insulating layer 63 (or the insulating layer) and the anode 64 (the first electrode). Then, the insulating layer is processed so that a part of the anode 64 (the first electrode) is exposed, and thus, a bank 65 is formed. As a material for the bank 65, a photosensitive organic material (such as acryl and polyimide) is preferably used; however, a non-photosensitive organic material or inorganic material may also be used. An end surface of the bank 65 toward the first electrode has curvature, and the end surface preferably has a tapered shape in which the curvature is changed continuously. (FIG. 4(B))

Then, a light-emitting lamination body 66 is formed to cover the anode 64 (the first electrode) that is disposed from the bank 65. The light-emitting lamination body 66 may be formed by an evaporation method or the like. In the present invention, the light-emitting lamination body 66 includes at least an electron transporting layer and a light emitting layer, wherein the electron transporting layer includes a first region that includes additives of substances containing a polycyclic condensed ring to flow current easily and a second region that does not include the additives.

It is to be noted that the second region is formed to have a film thickness of 5 nm or more, preferably 10 nm or more, which is a distance capable of suppressing energy transfer between excited species sufficiently.

When the first region of the electron transporting layer is doped with the additives to easily flow current, it can be formed by co-evaporation with a host material of the electron transporting layer. It is to be noted that a material for the second region that is not doped with the additives and a host material for the first region that is doped with the additives are the same. Therefore, a structure of the present invention can be easily and with shorter cycle time obtained rather than by providing a hole blocking layer that is formed of another material or the like between the light emitting layer and the electron transporting layer that is doped with the additives. (FIG. 4(C))

As a substance that has relatively high electron transporting property and can be used as a host material of the electron transporting layer, a metal complex that has a quinoline skeleton or a benzoquinoline skeleton such as tris(8-quinolinolato) aluminum (Abbreviation: $Alq_3$), tris(4-methyl-8-quinolinolato) aluminum (Abbreviation: $Almq_3$), bis(10-hydroxybenzo[h]-quinolinato) beryllium (Abbreviation: $BeBq_2$), and bis(2-methyl-8-quinolinolato)(4-phenylphenolato)aluminum (Abbreviation: BAlq), or the like can be used. By applying the structure according to the present invention, it is possible that the electron transporting layer has much higher electron transporting property, thereby reducing drive voltage of the thin film light emitting element.

As an additive that is added into the electron transporting layer, substances containing a polycyclic condensed ring such as rubrene, 9,10-diphenylanthracene, pentacene and perylene are given. A substance is particularly selected, in which electron injecting property or electron transporting property is higher than that of the host material of the first region. Moreover, both of electron injecting property and electron transporting property of the substance are expected to be high. It is to be noted that a highly electron injecting material means a material in which an LUMO level is lower than that in a material which mainly forms the first region. By applying the structure according to the present invention, the additives can be selected independently of an energy gap of a luminescent substance of the light emitting layer.

Various substances are given as a luminescent substance, and 4-dicyanomethylene-2-methyl-6-[2-(1,1,7,7-tetramethyljulolidine-9-yl)ethenyl]-4H-pyr an (Abbreviation: DCJT); 4-dicyanomethylene-2-t-butyl-6-[2-(1,1,7,7-tetramethyljulolidine-9-yl)ethenyl] -4H-pyra n (DCJTB); periflanthene; 2,5-dicyano-1,4-bis[2-(10-methoxy-1,1,7,7-tetramethyljulolidine-9-yl)ethenyl]benzene, N,N'-dimethylquinacridon (Abbreviation: DMQd), coumarin6, coumarin545T, tris(8-quinolinolate)aluminum (Abbreviation: $Alq_3$), 9,9'-bianthryl; 9, 10-diphenylanthracene (Abbreviation: DPA); 9,10-bis(2-naphthyl)anthracene (Abbreviation: DNA); 2,5,8,11-tetra-t-butylperyrene (Abbreviation: TBP); or the like can be used. In addition, other substances can also be used.

In the light-emitting lamination body 66, an electron injecting layer, a hole transporting layer, a hole injecting layer or the like may also be provided besides them.

As a highly hole transporting substance, an aromatic amine compound (namely, one having a benzene ring-nitride bond) such as, for example, 4,4'-bis[N-(1-naphthyl)-N-phenyl-amino]-biphenyl (Abbreviation: NPB), 4,4'-bis[N-(3-methylphenyl)-N-phenyl-amino]-biphenyl (Abbreviation: TPD), 4,4',4"-tris(N,N-diphenyl-amino)-triphenylamine (Abbreviation: TDATA), 4,4',4"-tris[N-(3-methylphenyl)-N-phenyl-amino]-triphenylamine (Abbreviation: MTDATA) and 4,4-bis(N-(4-(N,N-di-m-tolylamino)phenyl)-N-phenylamino)biphenyl (Abbreviation: DNTPD) can be given.

In addition, as a highly electron injecting substance, a compound of an alkali metal or an alkaline earth metal such as lithium fluoride (LiF), cesium fluoride (CsF) and calcium fluoride (CaF$_2$) can be given. In addition to that, a mixture of a highly electron transporting substance such as Alq$_3$ and an alkaline earth metal such as magnesium (Mg) may also be used.

As a highly hole injecting material, for example, metal oxides such as molybdenum oxide (MoOx), vanadium oxide (VOx), ruthenium oxide (RuOx), tungsten oxide (WOx) and manganese oxide (MnOx) can be given. In addition to that, a phthalocyanine compound such as phthalocyanine (Abbreviation: H$_2$Pc) or cupper phthalocyanine (CuPC) can also be used.

The light emitting layer may have a structure in which a light emitting element that has a different emission wavelength range is formed in each pixel and color display is conducted. Typically, light emitting elements for each color such as R (red), G (green) and B (blue) are formed. Also in this case, a structure is adopted, in which a filter (a colored layer) that transmits light of the emission wavelength range of each color is provided on the light-emitting side of the pixel. Therefore, it is intended that color purity is improved or a pixel portion is prevented from becoming a mirror surface (reflecting). By providing the filter (colored layer), it is possible to omit a circular polarizing plate, which has been considered to be necessary conventionally, and light emitted from the light emitting element is not lost. Further, change in color tone is reduced, which is generated when the pixel portion (display screen) is seen from the diagonal side.

In addition, the light emitting element can have a structure to emit monochromatic light or white light. When a material to emit white light is used, color display can be conducted by employing a structure in which a filter (a colored layer) that transmits light of a specific wavelength is provided on the light emitting side of the pixel.

In order to form a light emitting layer which emits white light, for example, Alq$_3$, Alq$_3$ partially doped with Nile Red that is a red luminescent pigment, Alq$_3$, p-EtTAZ and TPD (aromatic diamine) are laminated sequentially by an evaporation method to obtain white light.

Further, a triplet excited luminescent material containing a metal complex may be used for the light emitting layer in addition to a singlet excited luminescent material. For example, between a pixel that emits ret light, a pixel that emits green light and a pixel that emits blue light, the pixel that emits red light in which time to halve luminance is relatively short is formed of a triplet excited luminescent material, and the other pixels are formed of a singlet excited luminescent material. The triplet excited luminescent material is excellent in luminous efficiency; therefore, it has an advantage that power consumption is reduced to obtain the same luminance. In other words, when the triplet excited luminescent material is applied to the pixel that emits red light, the amount of current that flows to a light emitting element is reduced so that the reliability is improved. The pixel that emits red light and the pixel that emits green light may be formed by using the triplet excited luminescent material, and the pixel that emits blue light may be formed by using the singlet excited luminescent material to reduce power consumption. Power consumption can be further reduced by forming an element that emits green light that is highly visible for human by using the triplet excited luminescent material.

In one example of the triplet excited luminescent material, a metal complex is used as a dopant, and a metal complex including platinum that is a third transition series element as a centered metal, a metal complex including iridium as a centered metal or the like is known. The triplet excited luminescent material is not limited to these compounds; and a compound that has the above described structure and an element that belongs to Groups 8 to 10 of the periodic table as a centered metal can also be used.

The substances that form the light emitting layer as described above are one example, and layers that function as a hole injecting-transporting layer, a hole transporting layer, an electron injecting-transporting layer, an electron transporting layer, a light emitting layer, an electron blocking layer, a hole blocking layer and the like are laminated appropriately to form a light emitting element. In addition, a mixing layer or a mixing junction in which these layers are combined may be formed. A layer structure of the light emitting lamination body can be changed. Instead of including no specific electron injecting region or light-emitting region, an electrode mainly for this purpose can be provided or a luminescent material can be dispersed to be provided. Such a change can be allowed unless it departs from the spirit of the present invention.

A light emitting element that is formed of the materials as described above emits light by forward bias. A pixel of a display device that is formed by using a light emitting element can be driven by a simple matrix mode or an active matrix mode. In any case, each pixel emits light by applying forward bias at a specific timing; however, the pixel is in a non-luminescent state for a certain period. The reliability of a light emitting element can be improved by applying reverse bias in this non-luminescent time. In a light emitting element, there is deterioration that emission intensity is decreased under a constant driving condition, or a deterioration mode that a non-luminescent region is broadened in the pixel and luminance is apparently decreased. However, deterioration progress can be slowed down by conducting alternating driving in which bias is applied forwardly and reversely. Therefore, the reliability of a light emitting device can be improved.

Next, a second electrode (cathode) 67 is formed to cover the light-emitting lamination body 66. By this step, a light emitting element 93 that is formed of the anode 64 (the first electrode), the light-emitting lamination body 66 and the second electrode (cathode) 67 can be manufactured.

Then, a silicon oxide film containing nitride is formed by a plasma CVD method as a second passivation film. When the silicon oxide film containing nitride is used, a silicon oxynitride film that is manufactured with SiH$_4$, N$_2$O and NH$_3$, a silicon oxynitride film that is manufactured with SiH$_4$ and N$_2$O, a silicon oxynitride film that is manufactured with a gas in which SiH$_4$ and N$_2$O are diluted by Ar, or the like may be formed by a plasma CVD method.

A hydrogenated silicon oxynitride film that is manufactured with SiH$_4$, N$_2$O and H$_2$ may also be applied as a first passivation film. The second passivation film 905 is not limited to a single layer structure, and another insulating layer containing silicon may also be used as a single layer structure or a laminated structure. In addition, a multilayer film of a carbon nitride film and a silicon nitride film, a multilayer film of styrene polymers, silicon nitride film or a diamond like carbon film may also be formed instead of the silicon oxide film containing nitride.

Then, a display portion is sealed so that an electroluminescent element is protected from a substance such as water, which promotes deterioration. When a counter substrate is used for sealing, it is attached by an insulating sealing material so that an external connecting portion is exposed. A space between the counter substrate and an element substrate may be filled with an inert gas such as dried nitrogen. In addition, the counter substrate may be formed by applying a sealing material on the entire surface of the pixel portion. An UV cured resin or the like is preferably used for the sealing material. A desiccating agent or grains to keep a constant gap may also be mixed in the sealing material. Then, a flexible wiring substrate is attached to the external connecting portion to complete the display device.

One example of a structure of the display device that is manufactured as described above will be described with reference to FIG. 5. It is to be noted that portions that have different shapes but the same function are put with the same reference numerals and an explanation thereof is omitted. In the present embodiment mode, a thin film transistor 70 that has an LDD structure is connected to a light emitting element 93 through a connection portion 61a.

Figure 5A:
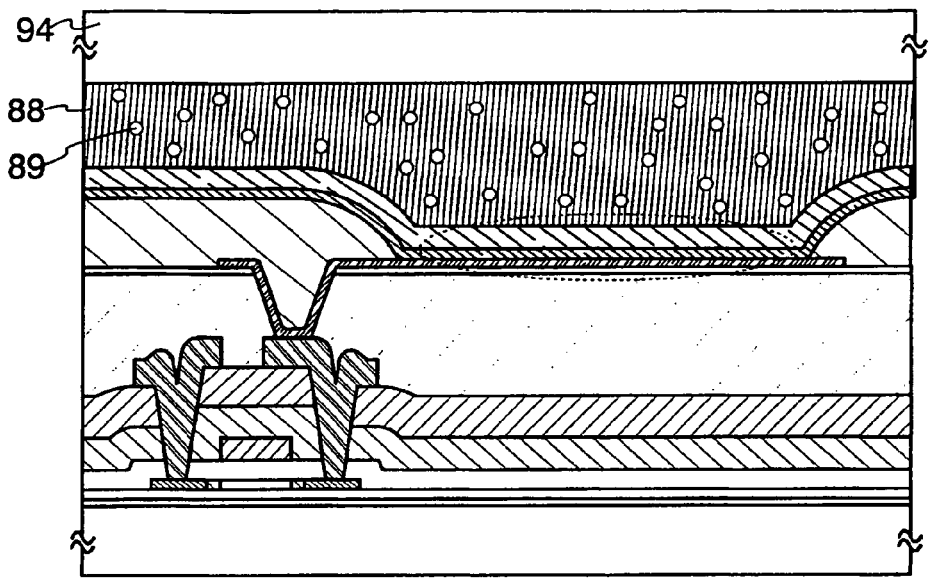
FIGS. 5(A)-5(B) are diagrams each illustrating a structure of a display device.

FIG. 5(A) shows a structure in which the anode 64 (the first electrode) is formed of a conductive film having light-transmitting property and light that is emitted from the light emitting lamination body 66 is extracted toward the substrate 50 side. It is to be noted that reference numeral 94 denotes a counter substrate that is attached to the substrate 50 by a sealing material after the light emitting element 93 is formed. It can be prevented from being deteriorated light emitting element 93 due to water by filling a resin 88 having light-transmitting property or the like between the counter substrate 94 and the element, and by sealing. In addition, the resin 88 preferably has the hygroscopicity. When a highly light transmitting desiccating agent 89 is further dispersed in the resin 88, influence of water can be suppressed, which is a more desirable structure.

Figure 5B:
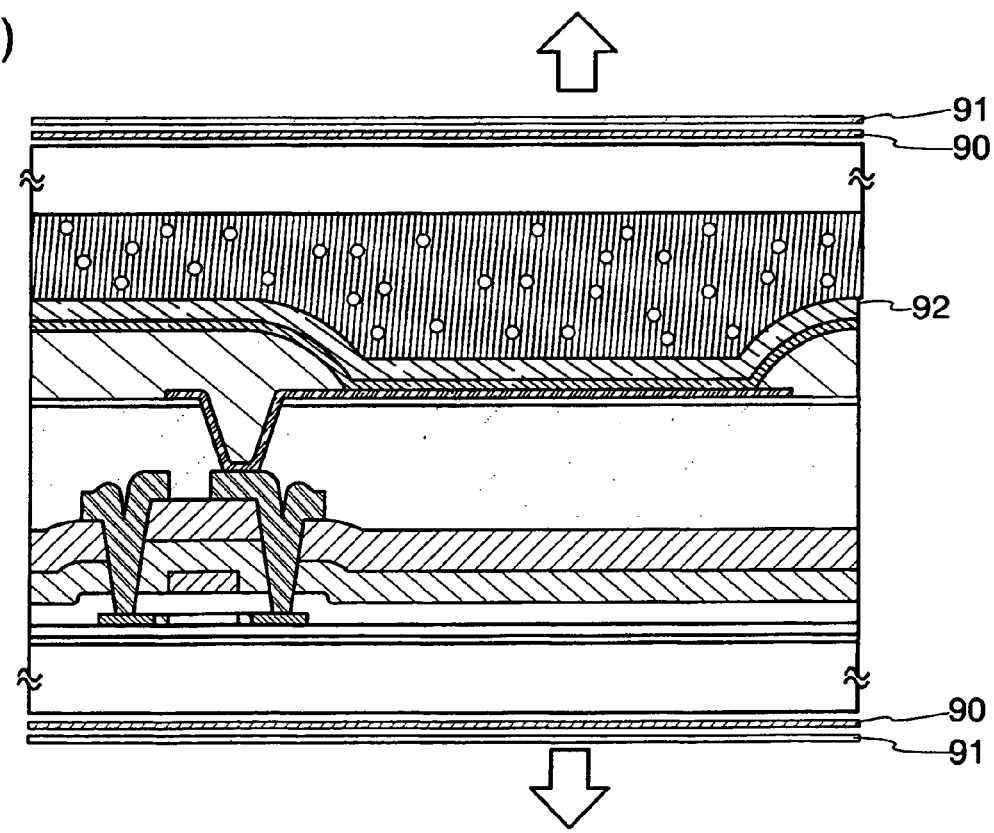

FIG. 5(B) shows a structure in which both of the anode 64 (the first electrode) and the second electrode 92 are formed of a conductive film having light-transmitting property and light can be extracted toward both of the substrate 50 and the counter substrate 94. In this structure, a screen is prevented from being seen through by providing a polarizing plate 90 outside of the substrate 50 and the counter substrate 94, and visibility is improved. A protective film 91 may be provided outside of the polarizing plate 90.

It is to be noted that either of an analog video signal or a digital video signal may be used for the display device according to the present invention, which has a display function. When the digital video signal is used, the video signal is divided into a signal using voltage and a signal using current. Video signals that are inputted into a pixel in luminescence of a light emitting element include a constant-voltage signal and a constant-current signal. The constant-voltage video signals include a signal in which voltage applied to a light emitting element is constant and a signal in which current applied to a light emitting element is constant. Further, the constant-current video signals include a signal in which voltage applied to a light emitting element is constant and a signal in which current applied to a light emitting element is constant. When the voltage applied to the light emitting element is constant, it is constant-voltage drive, and when the current applied to the light emitting element is constant, it is constant-current drive. In the constant-current drive, constant current is applied independently of change in resistance of the light emitting element. Any driving method as described above can be used for the light emitting display device according to the present invention and a driving method thereof.

In the display device according to the present invention that is manufactured by the method as described in the present embodiment mode, drive voltage is low, and color purity and luminous efficiency are favorable.

Embodiment Mode 3

Figure 6:
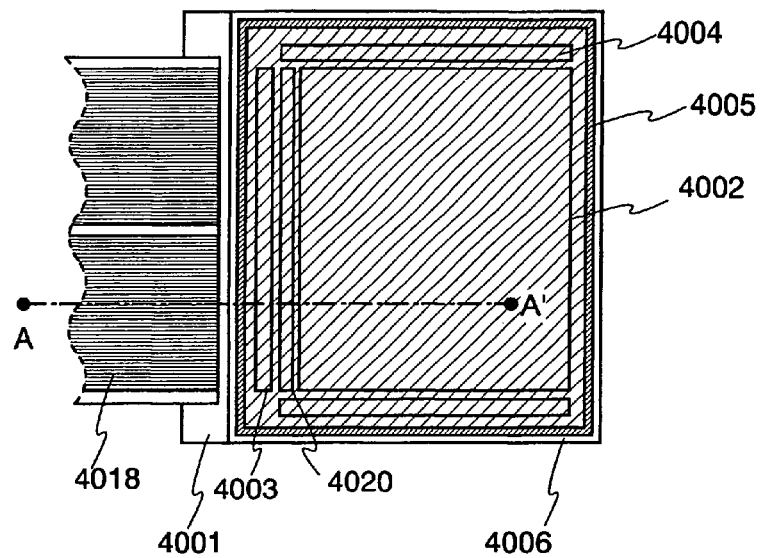
FIG. 6(A) is a top view and FIG. 6(B) is a cross-sectional view of a light emitting device according to the present invention.
Figure 6:
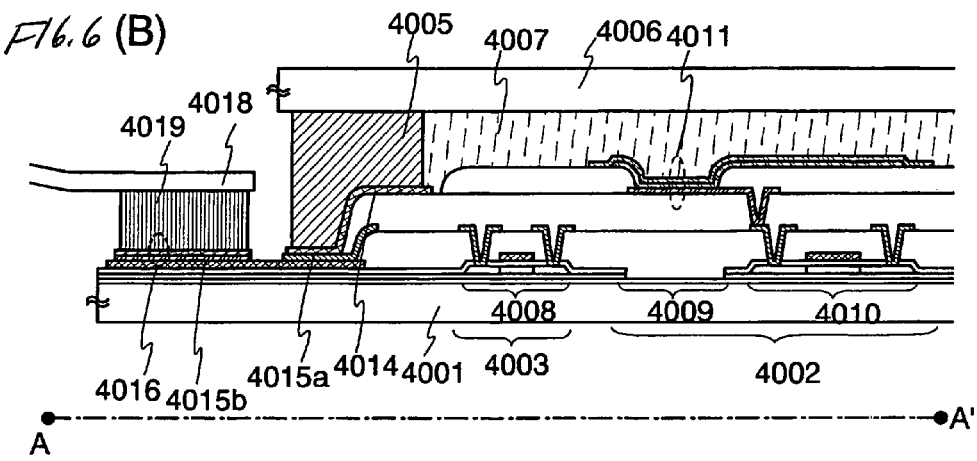

In the present embodiment mode, the appearance of a panel of a light emitting device corresponding to one mode of the present invention will be described with reference to FIGS. 6(A) to 6(B). FIG. 6(A) is a top view of a panel in which a transistor and a light emitting element that are formed over a substrate are sealed with a sealing material that is formed between the substrate and a counter substrate 4006. FIG. 6(B) is a cross-sectional view of FIG. 6(A). In addition, a structure of the light emitting element that is mounted in the panel is as follows: the light emitting element includes an anode, a hole transporting layer, a light emitting layer containing a luminescent substance, an electron transporting layer and a cathode; the electron transporting layer is divided into two layer regions; a first region that is closer to the cathode is doped with additives containing a polycyclic condensed ring and a second region that is closer to the light emitting layer is not doped with additives containing a polycyclic condensed ring.

A sealing material 4005 is provided to surround a pixel portion 4002, a signal line driving circuit 4003 and a scanning line driving circuit 4004 that are provide over a substrate 4001. In addition, the counter substrate 4006 is provided over the pixel portion 4002, the signal line driving circuit 4003 and the scanning line driving circuit 4004. Therefore, the pixel portion 4002, the signal line driving circuit 4003 and the scanning line driving circuit 4004 are sealed by the substrate 4001, the sealing material 4005 and the counter substrate 4006 with a filler 4007.

Moreover, the pixel portion 4002, the signal line driving circuit 4003 and the scanning line driving circuit 4004 that are provided over the substrate 4001 include a plurality of thin film transistors. FIG. 6(B) shows a thin film transistor 4008 that is included in the signal line driving circuit 4003 and a thin film transistor 4010 that is included in the pixel portion 4002.

Reference numeral 4011 denotes a light emitting element that is electrically connected to the thin film transistor 4010.

Furthermore, a lead wiring 4014 corresponds to a wiring to supply a signal or power supply voltage to the pixel portion 4002, the signal line driving circuit 4003 and the scanning line driving circuit 4004. The lead wiring 4014 is connected to a connection terminal 4016 through a lead wiring 4015a and a lead wiring 4015b. The connection terminal 4016 is electrically connected to a terminal of a flexible printed circuit (FPC) 4018 through an anisotropic conductive film 4019.

As the filler 4007, an UV-cured resin or a thermosetting-cured resin can be used in addition to an inert gas such as nitrogen or argon. Specifically, polyvinyl chloride, acryl, polyimide, epoxy resin, silicon resin, polyvinyl butyral, or ethylene vinylene acetate can be employed.

It is to be noted that a panel provided with a pixel portion that includes a light emitting element and a module in which an IC is mounted on the panel are included in a category of the display device according to the present invention.

In the panel and the module that have a structure as described in the present embodiment mode, drive voltage is low, and color purity and luminous efficiency are favorable.

Embodiment Mode 4

As electronic devices according to the present invention in which a module is mounted, one example of which is shown in Embodiment Mode 3, a video camera, a digital camera, a goggle type display (a head mounted display), a navigation system, an audio reproduction device (such as a car audio component), a computer, a game machine, a portable information terminal (such as a mobile computer, a cellular phone, a portable game machine and an electronic book), an image reproduction device provided with a recording medium (typically, a device which can reproduce the recording medium such as a digital versatile disc (DVD) and display images thereof), and the like are given. Specific examples of these electronic devices are shown in FIGS. 7(A) to 7(E).

Figure 7:
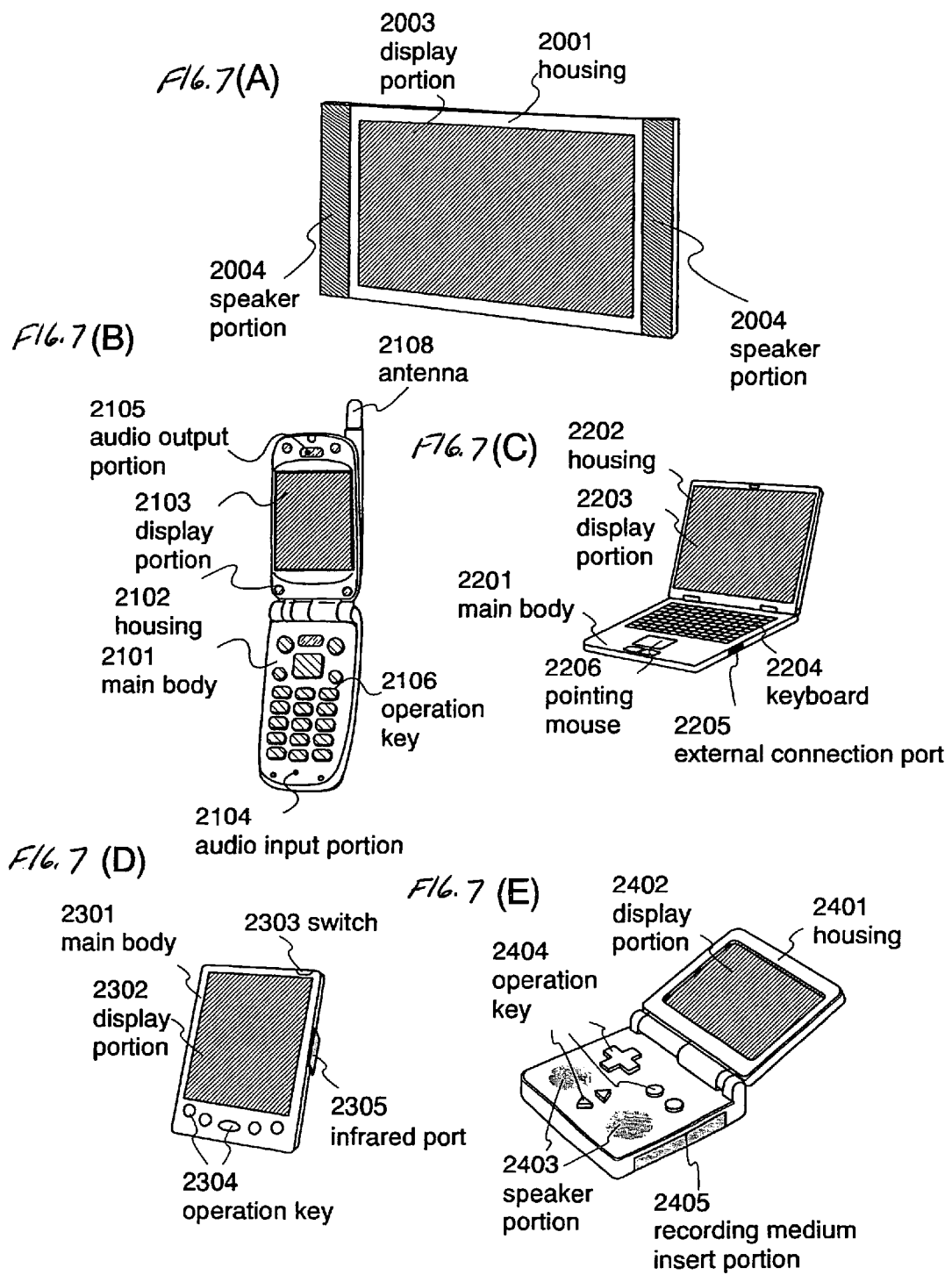
FIGS. 7(A)-7(E) are diagrams illustrating electronic devices to which the present invention can be applied.

FIG. 7(A) is a light emitting display device, which corresponds to a monitor of a TV set, a personal computer or the like. The light emitting display device includes a housing 2001, a display portion 2003, speaker portions 2004 and the like. In the light emitting display device according to the present invention, drive voltage of the display portion 2003 is low, and color purity and luminous efficiency are favorable. In order to improve the contrast, a pixel portion may be provided with a polarizing plate or a circular polarizing plate. For example, it is preferable that a ¼λ plate, a ½λ plate and a polarizing plate are provided in this order for a sealing substrate. In addition, an antireflection film may be provided over the polarizing plate.

FIG. 7(B) shows a cellular phone, which includes a main body 2101, a housing 2102, a display portion 2103, an audio input portion 2104, an audio output portion 2105, operation keys 2106, an antenna 2108 and the like. In the cellular phone according to the present invention, drive voltage of the display portion 2103 is low, and color purity and luminous efficiency are favorable.

FIG. 7(C) shows a computer, which includes a main body 2201, a housing 2202, a display portion 2203, a keyboard 2204, an external connection port 2205, a pointing mouse 2206 and the like. In the computer according to the present invention, drive voltage of the display portion 2203 is low, and color purity and luminous efficiency are favorable. Although a laptop computer is exemplary shown in FIG. 7(C), the present invention can also be applied to a desktop type computer in which a hard disk is formed unified with a display portion, and the like.

FIG. 7(D) shows a mobile computer, which includes a main body 2301, a display portion 2302, a switch 2303, operation keys 2304, an infrared port 2305 and the like. In the mobile computer according to the present invention, drive voltage of the display portion 2302 is low, and color purity and luminous efficiency are favorable.

FIG. 7(E) shows a portable game machine, which includes a housing 2401, a display portion 2402, speaker portions 2403, operation keys 2404, a recording medium insert portion 2405 and the like. In the portable game machine according to the present invention, drive voltage of the display portion 2402 is low, and color purity and luminous efficiency are favorable.

As described above, the application range of the present invention is extremely wide and can be applied to electronic devices in various fields.

Embodiment Mode 5

Figure 8:
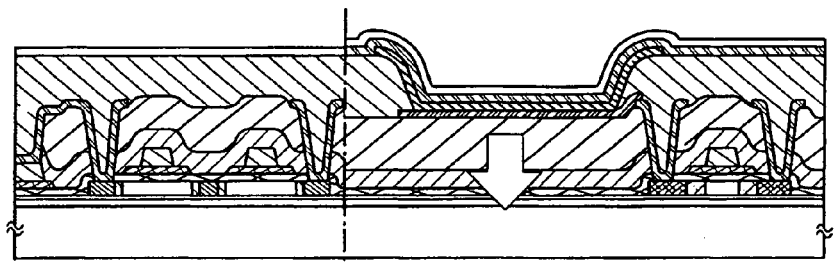
FIGS. 8(A)-8(C) are diagrams each illustrating a structure of a display device.
Figure 8:
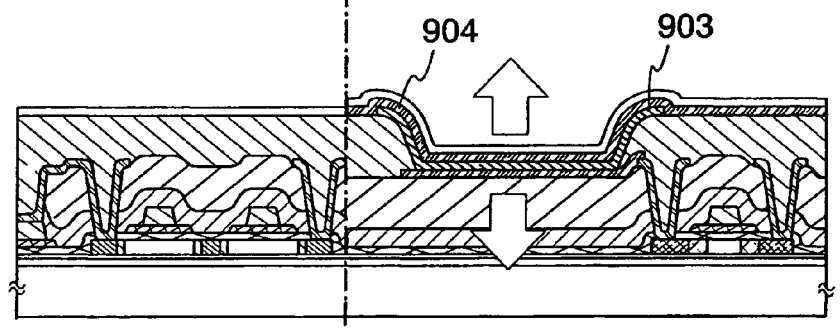
Figure 8:
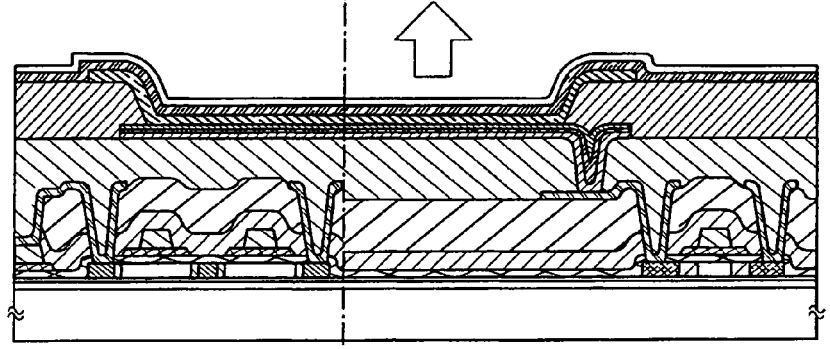

FIGS. 8(A) to 8(C) shows examples of bottom emission, dual emission and top emission. The structure whose manufacturing steps are described in Embodiment Mode 2 corresponds to a structure of FIG. 8(C). FIGS. 8(A) and 8(B) show structures in which a first interlayer insulating layer in FIG. 8(C) is formed of a material that has self-planarizing property, and a wiring of a thin film transistor and a first electrode of a light emitting element are formed over the same insulating layer. FIG. 8(A) shows a structure of bottom emission in which only the first electrode of the light emitting element is formed of a material having light-transmitting property and light is emitted to the lower side of the light emitting device. In FIG. 8(B), a material containing Li is formed below a second electrode to be thin (so as to transmit light), and a material having light transmitting property such as ITO, ITSO and IZO is formed as the second electrode so that a dual emission type light emitting display device can be obtained, in which light can be extracted from both sides as shown in FIG. 8(B). It is to be noted that a second electrode does not transmit light when the second electrode is formed by a thick film of aluminum, silver or the like; however, if the thin film thereof is used, the second electrode transmits light, and thus, dual emission can be obtained by forming the second electrode by a thin film of aluminum, silver or the like that is thin enough to transmit light.

ITO or ITSO that is a transparent electrode used in dual emission or top emission is not easily formed by evaporation; therefore, it is formed by a sputtering method. When a second electrode 904 is formed by a sputtering method, damage due to sputtering sometimes occurs in a surface of an electron injecting layer or an interface between the electron injecting layer and an electron transporting layer; thus, there is a possibility that property of the light emitting element can be adversely influenced. In order to avoid this, a material that is not easily damaged by sputtering may be provided at the closest position to the second electrode 904. As a material that is not easily damaged by sputtering as described above and can be used for a light-emitting lamination body 903, molybdenum oxide (MoOx) can be given. However, since MoOx is a material suitable for the hole injecting layer, the second electrode 904 has to be an anode in order to provide MoOx to be in contact with the second electrode 904. An element in which the first electrode is a cathode and the second electrode is an anode as described above is referred to as an inversely laminated element here.

Figure 9:
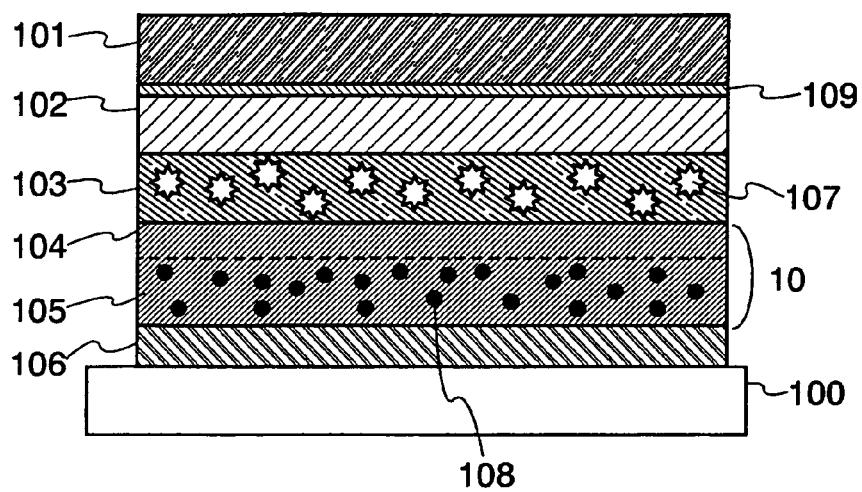
FIGS. 9(A)-9(C) are diagrams each showing a structure of a thin film light emitting element according to the present invention.
Figure 9:
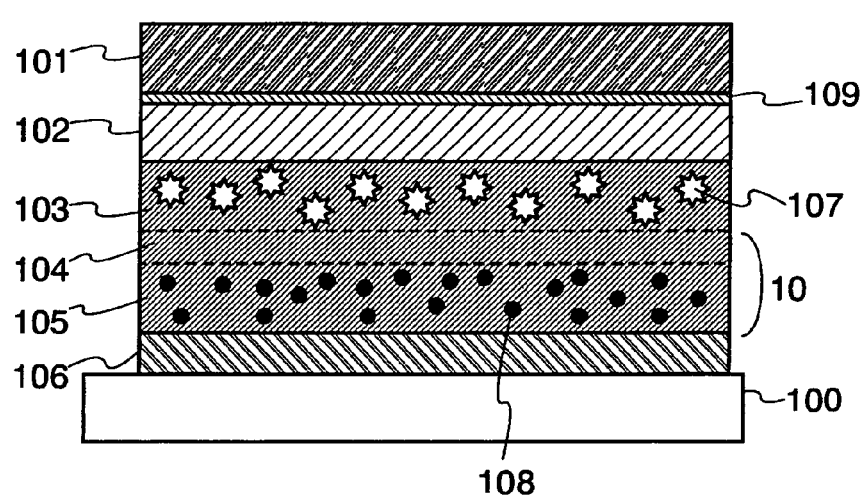
Figure 9:
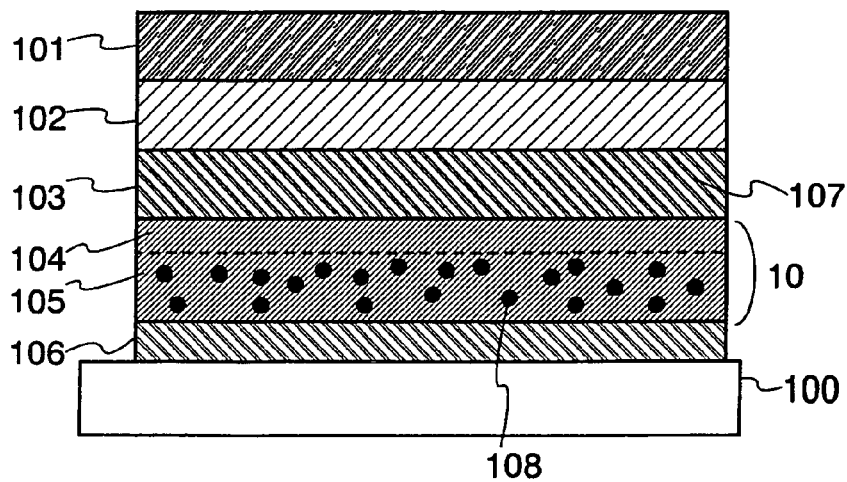

Therefore, in the case of the inversely laminated element, a first electrode is formed as a cathode 106 over a substrate 100 or an insulating surface such as an insulating film that is formed over the substrate 100 as shown in FIG. 9. Then, an electron injecting layer (omitted here), an electron transporting layer 10, a light emitting layer 103, a hole transporting layer 102, a hole injecting layer 109 (MoOx) and an anode 101 (a second electrode) are formed sequentially. In addition, in the case of an active matrix type display device, a thin film transistor for driving a pixel needs to be an N-channel type.

MoOx is formed by an evaporation method, and MoOx in which x=3 or more is preferably used. Moreover, an MoOx layer may be an organic or inorganic mixed layer by co-evaporation with an organic metal complex such as copper phthalocyanine (CuPc) or an organic material. When the inversely laminated element is used, a transistor, in which a-Si: H that is originally N-type is a semiconductor layer, is preferably used for a thin film transistor of the pixel portion to simplify the steps. When the driving circuit portion is formed over the same substrate, only the driving circuit portion may be irradiated with laser or the like to be crystallized and used.

It is to be noted that an element may be formed by inverse lamination without using MoOx when sputter damages in formation of an anode causes no problem. FIGS. 9(A) to 9(C) shows examples of inversely laminated elements corresponding to FIGS. 1(A) to 1(C), respectively. The present invention can also be applied to such an inversely laminated element, and the invention can provide a light emitting element which functions effectively, realizes low voltage drive and causes no deterioration in color purity and current efficiency.

Embodiment Mode 6

In the present embodiment mode, a panel, a pixel circuit of a module and a protection circuit that are explained in Embodiment Mode 3 and operation thereof will be described. It is to be noted that the cross-sectional views that have been shown in FIGS. 3(A) to 4(C) are cross-sectional views of a driving TFT 1403 and a light emitting element 1405.

Figure 10:
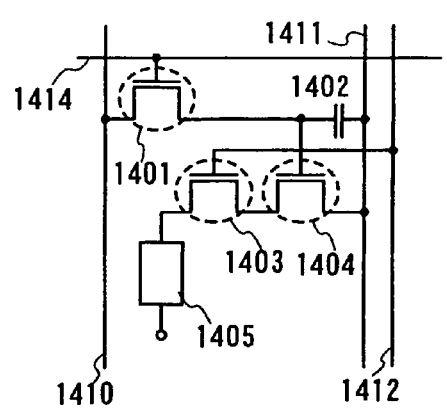
FIGS. 10(A)-10(F) are diagrams each showing one example of a pixel circuit of a display device.
Figure 10:
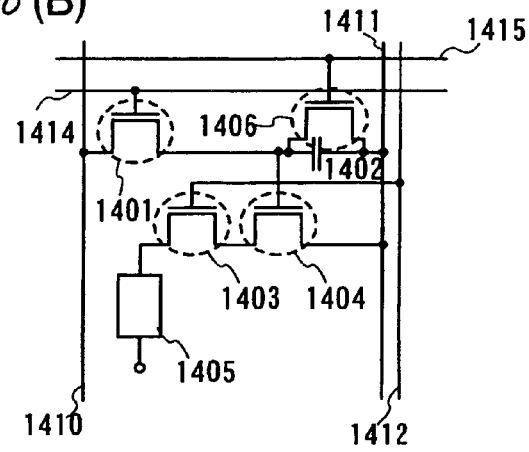
Figure 10:
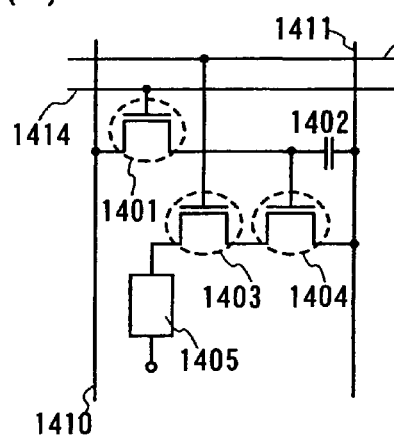
Figure 10:
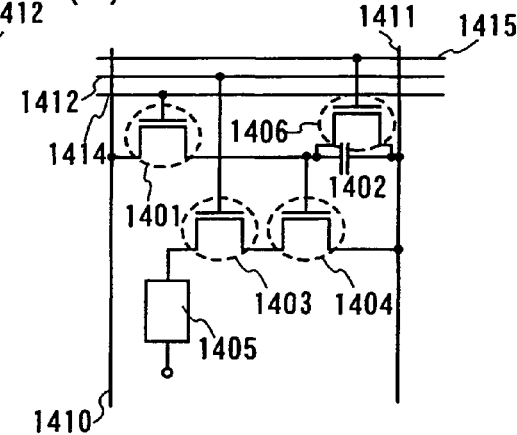
Figure 10:
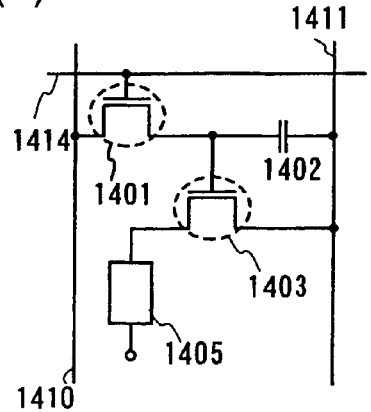
Figure 10:
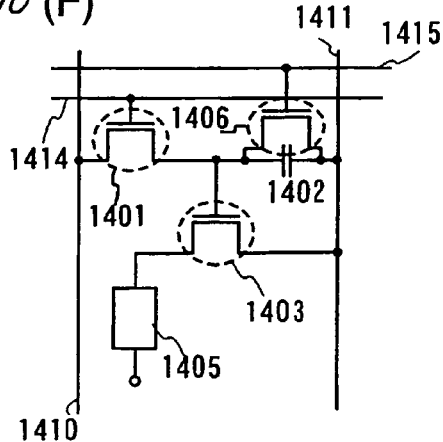

In a pixel shown in FIG. 10(A), a signal line 1410 and power supply lines 1411 and 1412 are arranged in a column direction, and a scanning line 1414 is arranged in a row direction. In addition, a switching TFT 1401, a driving TFT 1403, a current control TFT 1404, a capacitor element 1402 and a light emitting element 1405 are also included.

A pixel shown in FIG. 10(C) has the same structure as the pixel shown in FIG. 10(A), but is different in that a gate electrode of the driving TFT 1403 is connected to the power supply line 1412 that is arranged in the row direction. That is to say, both pixels shown in FIGS. 10(A) and 10(C) indicate the same equivalent circuit. However, in the case where the power supply line 1412 is arranged in the row direction (FIG. 10(A)) and where the power supply line 1412 is arranged in the column direction (FIG. 10(C)), each power supply line is formed of a conductive film of a different layer. Here, attention is paid to a wiring, to which the gate electrode of the driving TFT 1403 is connected, and FIGS. 10(A) and 10(C) are separately described in order to indicate that a different layer is used to manufacture these.

A feature of the pixels shown in FIGS. 10(A) and 10(C) is that the driving TFT 1403 and the current control TFT 1404 are connected in series in the pixel. The channel length L (1403) and the channel width W (1403) of the driving TFT 1403, and the channel length L (1404) and the channel width W (1404) of the current control TFT 1404 may be set so as to fulfill L (1403)/W (1403):L (1404)/W (1404)=5 to 6000:1.

It is to be noted that the driving TFT 1403 operates in a saturation region and has a finction of controlling the value of current which flows into the light emitting element 1405, and the current control TFT 1404 operates in a linear region and has a function of controlling supply of current to the light emitting element 1405. It is preferable that both TFTs have the same conductive type in manufacturing step, and an n-channel type TFT is formed in the present embodiment mode. Moreover, not only an enhancement type but also a depletion type TFT may be used for the driving TFT 1403. In the present invention that has the structure as described above, a slight change in Vgs of the current control TFT 1404 dose not influence the current value of the light emitting element 1405 since the current control TFT 1404 operates in the linear region. In other words, the current value of the light emitting element 1405 can be determined by the driving TFT 1403 that operates in the saturation region. According to the structure, luminance unevenness of the light emitting element due to variation in TFT characteristics is improved, thereby providing a display device with the improved image quality.

In the pixels shown in FIGS. 10(A) to 10(D), the switching TFT 1401 controls input of a video signal to the pixel. When the switching TFT 1401 is turned on, a video signal is inputted into the pixel. Then, voltage of the video signal is retained in the capacitor element 1402. It is to be noted that the structure provided with the capacitor element 1402 is shown in FIGS. 10(A) and 10(C), but the present invention is not limited thereto. Moreover, the capacitor element 1402 may not be provided when capacitance that retains the video signal can employ gate capacitance or the like.

The pixel shown in FIG. 10(B) has the same pixel structure as shown in FIG. 10(A) except that a TFT 1406 and a scanning line 1414 are additionally provided. Similarly, the pixel shown in FIG. 10(D) has the same pixel structure as shown in FIG. 10(C) except that the TFT 1406 and the scanning line 1414 are additionally provided.

The TFT 1406 is controlled to be turned on or turned offby the newly provided scanning line 1414. When the TFT 1406 is turned on, charges that are retained by the capacitor element 1402 are discharged and the current control TFT 1404 is turned off. In other words, the light emitting element 1405 is made to be in a state in which no current flows by the arrangement of the TFT 1406. Therefore, the TFT 1406 can be referred to as an erasing TFT. Thus, the structures of FIGS. 10(B) and 10(D) can improve the duty ratio without waiting the writing of the signal to all the pixels since the lighting time can be started at the same time or right after start of the writing time.

In the pixel shown in FIG. 10(E), a signal line 1410 and a power supply line 1411 are arranged in a column direction, and a scanning line 1414 is arranged in a row direction. In addition, a switching TFT 1401, a driving TFT 1403, a capacitor element 1402 and a light emitting element 1415 are also included. The pixel shown in FIG. 10(F) has the same pixel structure as shown in FIG. 10(E) except that the TFT 1406 and the scanning line 1415 are additionally provided. It is to be noted that a structure of FIG. 10(F) can also improve the duty ratio by the arrangement of the TFT 1406.

As described above, various pixel circuits can be employed. In particular, a semiconductor film of the driving TFT 1403 is preferably enlarged when a thin film transistor is formed of an amorphous semiconductor film. Therefore, in the pixel circuit, a top emission type in which light from the electroluminescent layer is emitted from the sealing substrate side is preferably used.

The active matrix type light emitting device as described above is considered to be advantageous since TFTs are provided in each pixel and low voltage drive can be realized when pixel density is increased.

In the present embodiment mode, the active matrix type light emitting device has been described, in which each TFT is provided in one pixel; however, a passive matrix type light emitting device can also be formed, in which a TFT is provided per column. The passive matrix type light emitting device has a high aperture ratio since a TFT is not provided in each pixel. In the case of a light emitting device in which light is emitted to both sides of the electroluminescent layer, transmittance is improved when the passive matrix type display device is used.

In the display device according to the present invention that further includes the pixel circuit as described above, drive voltage is low, color purity and luminous efficiency are favorable, and further, the display device having the respective characteristics can be obtained.

Next, the case of providing a diode, as a protection circuit, to a scanning line and a signal line by using an equivalent circuit shown in FIG. 10(E) will be described.

Figure 11:
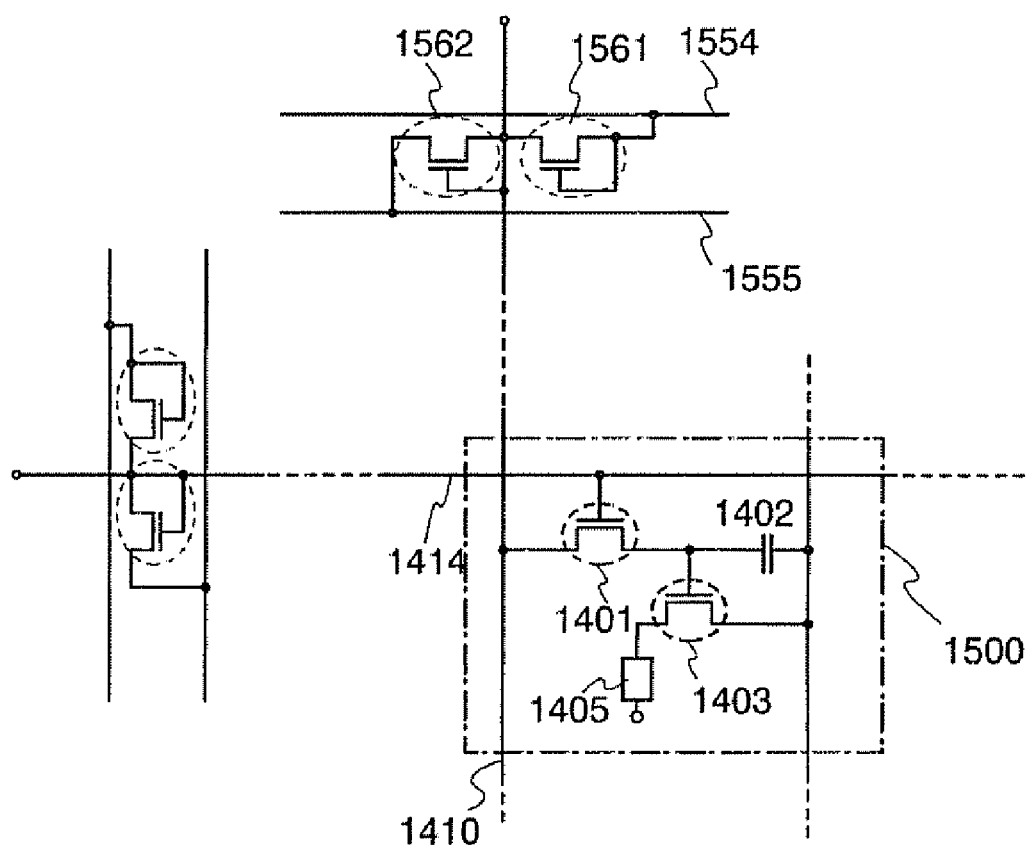
FIG. 11 is a diagram showing one example of a protection circuit of a display device.

In FIG. 11, switching TFTs 1401 and 1403, a capacitor element 1402, and a light emitting element 1405 are provided in a pixel portion 1500. Diodes 1561 and 1562 are provided to a signal line 1410. The diodes 1561 and 1562 are manufactured based on the embodiment mode described above similarly to the switching TFTs 1401 or 1403, and include a gate electrode, a semiconductor layer, a source electrode, a drain electrode and the like. The diodes 1561 and 1562 operate as a diode by connecting the gate electrode to the drain electrode or the source electrode.

Common potential lines 1554 and 1555 that are connected to the diodes are formed with the same layer as the gate electrode. Therefore, a contact hole is required to be formed in a gate insulating layer in order to connect to the source electrode or the drain electrode of the diodes.

Diodes that are provided for the scanning line 1414 also have the same structure.

As described above, according to the present invention, a protection diode that is provided in an input stage can be formed at the same time. It is to be noted that the position of forming the protection diode is not limited thereto, and the protection circuit can also be provided between the driving circuit and the pixel.

In the display device according to the present invention including the protection circuit like this, drive voltage is low, color purity and luminous efficiency are favorable, and further, the reliability as a display device can be improved.

EMBODIMENT 1

In Embodiment 1, a thin film light emitting element is manufactured, in which a hole injecting layer 109 and an electron injecting layer are provided in addition to the structure as described in FIG. 1(A) in which a host material of the light emitting layer and a host material of the first region are different. Then, a measurement is conducted. In the present embodiment, ITSO as an anode 101 (first electrode), DNTPD of 50 nm as a hole injecting layer, NPB of 10 nm as a hole transporting layer, t-BuDNA of 40 nm added with TBP as a luminescent substance 107 as a light emitting layer 103, Alq3 of 10 nm as a second region 104 of an electron transporting layer 10, Alq3 of 10 nm added with rubrene as additives 108 as a first region 105 are laminated. Further, CaF as an electron injecting layer and aluminum as a cathode 106 (second electrode) are laminated thereover to form a light emitting element.

TBP that is the luminescent substance 107 in the light emitting layer 103 is added at the ratio of 0.01 when the amount of t-BuDNA that is a host material in the light emitting layer 103 is 1. In addition, rubrene that is the additives 108 in the first region of the electron transporting layer is added at the ratio of 1 when the amount of Alq3 that is a host material in the electron transporting layer 10 is 1.

As to Comparative example 1, the first region and the second region are not provided, and Alq3 of 20 nm added with rubrene as an additive is formed instead. In this structure, a hole injecting layer and an electron injecting layer are provided in addition to the structure of FIG. 2. The other structures are the same as in Embodiment 1.

Further, as to Comparative example 2, the first region and the second region are not provided, and Alq3 of 20 nm not added with rubrene is formed instead. The other structures are the same as in Embodiment 1.

Figure 12:
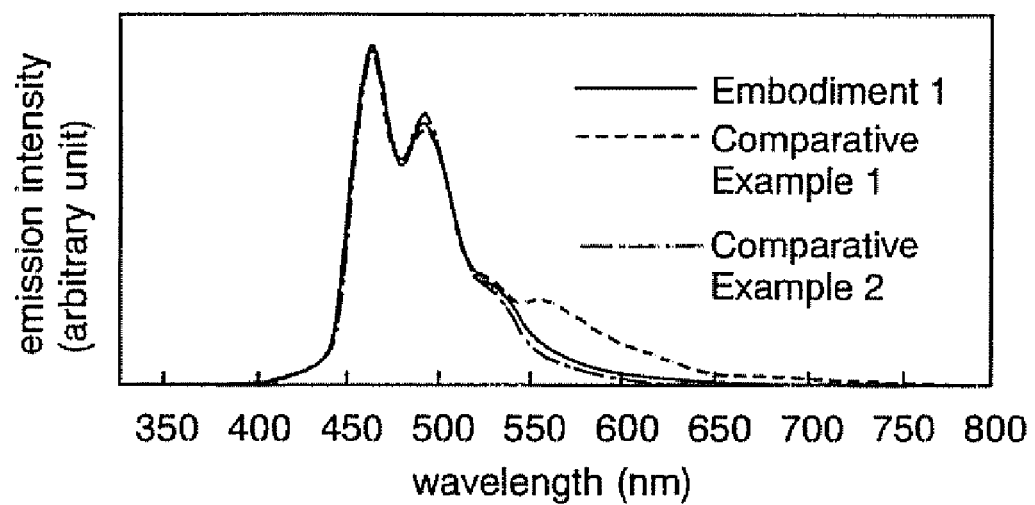
FIG. 12 illustrates Spectrum data of Embodiment 1, Comparative Example 1 and Comparative Example 2.

Results of the measurement of the thin film light emitting elements that are manufactured as described above are shown in Table 1, FIG. 12 and FIG. 13. It is to be noted that current efficiency described in Table 1 is efficiency in the case of 300 cd/m2.

TABLE 1

| | chromaticity x | chromaticity y | efficiency (cd/A) |
|---|---|---|---|
| Embodiment 1 | 0.1549 | 0.2521 | 4.0555 |
| Comparative Example 1 | 0.2052 | 0.2848 | 1.1965 |
| Comparative Example 2 | 0.1468 | 0.2476 | 3.0804 |

First, since TBP is a luminescent substance that emits blue light, an energy gap of TBP is larger than that of rubrene that emits yellow light. In the case of a substance that emits fluorescence, it can be said that an energy gap can be estimated from a luminescent color, and a substance that provides a luminescent color of a shorter wavelength has a larger energy gap.

Since TBP has a larger energy gap than that of rubrene, it is considered that energy is transferred from TBP to rubrene and rubrene emits light in Comparative Example 1. Change in spectrum shape that is considered to be luminescence by rubrene is observed in the vicinity of 560 nm of the spectrum of Comparative Example 1 in FIG. 12. Further, according to Table 2, current efficiency becomes worse in Comparative Example 1.

In Comparative Example 2, rubrene is not added so that change in spectrum shape due to luminescence of rubrene is not observed as a matter of course. In Embodiment 1 in which rubrene is added into the second region of the electron transporting layer, change in spectrum due to luminescence of rubrene is not observed, either.

In addition, as for chromaticity in Table 1, chromaticity of Embodiment 1 and Comparative Example 1 is almost the same; however, it is understood that chromaticity of Comparative Example 1 is changed to be whitish. According to this result, it is proved that color purity is not deteriorated in such a light emitting element that has a structure according to the present invention, even when a luminescent substance added to the light emitting layer has an energy gap that is larger than that of the additives added into the electron transporting layer.

Figure 13:
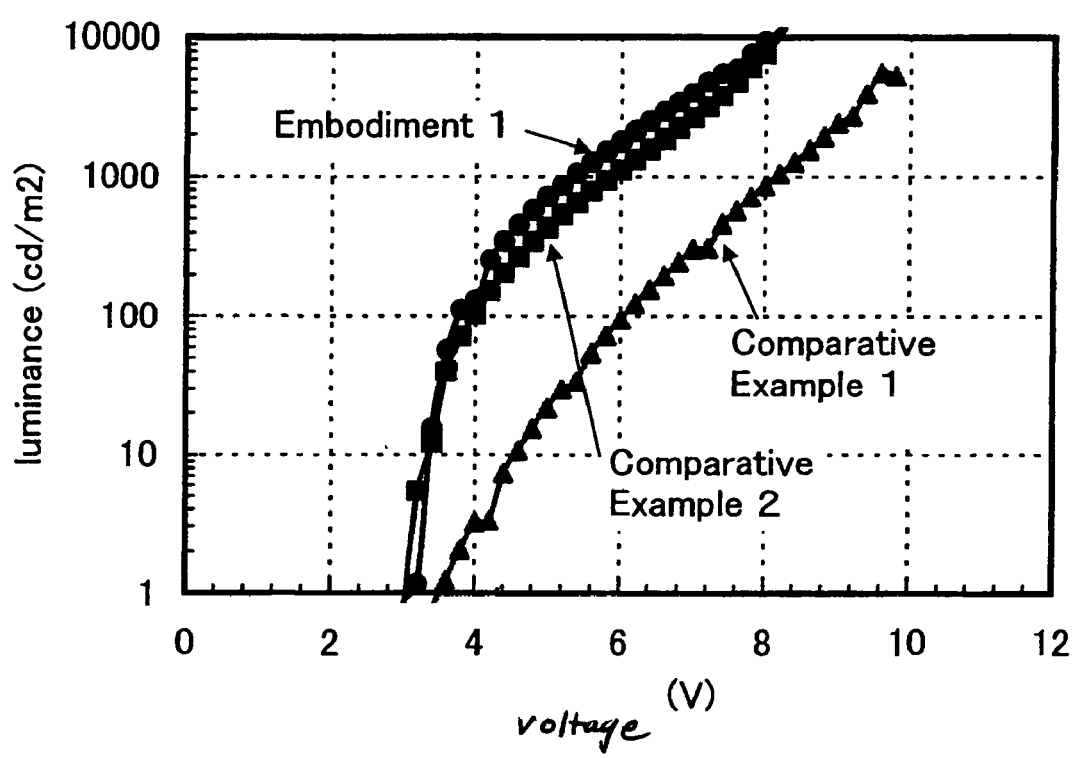
FIG. 13 illustrates Voltage-Luminance curves of Embodiment 1, Comparative Example 1 and Comparative Example 2.

Moreover, according to FIG. 13, it is understood that the same luminance is obtained at lower voltage and low voltage drive is realized in the light emitting element in Embodiment 1.

EMBODIMENT 2

In Embodiment 2, a thin film light emitting element is manufactured, in which an electron injecting layer is provided in addition to the structure described in FIG. 1(B). Then, a measurement is conducted. In the present embodiment, ITSO as an anode 101 (first electrode), DNTPD of 50 nm as a hole injecting layer 109, NPB of 10 nm as a hole transporting layer, Alq3 of 40 nm added with coumarine6 as a luminescent substance 107 as a light emitting layer 103, Alq3 of 10 nm as a second region 104 of an electron transporting layer 10, Alq3 of 10 nm added with rubrene as additives 108 as a first region 105 are laminated. Further, CaF as an electron injecting layer and aluminum as a cathode 106 (second electrode) are laminated thereover to form a light emitting element.

Coumarine6 that is the luminescent substance 107 in the light emitting layer 103 is added at the ratio of 0.005 when the amount of Alq3 that is a host material in the light-emitting layer 103 is 1. In addition, rubrene that is the additives 108 in the first region of the electron transporting layer is added at the ratio of 1 when the amount of Alq3 that is a host material in the electron transporting layer 10 is 1.

As to Comparative Example 3, as an electron transporting layer, the first region and the second region are not provided, and Alq3 of 20 nm added with rubrene as an additive is formed. In this structure, a hole injecting layer and an electron injecting layer are provided in addition to the structure of FIG. 2. The other structures are the same as in Embodiment 1.

In addition, as to Comparative Example 4, Alq3 of 20 nm not added with rubrene as an additive is formed as an electron transporting layer. The other structures are the same as in Embodiment 1.

Figure 14:
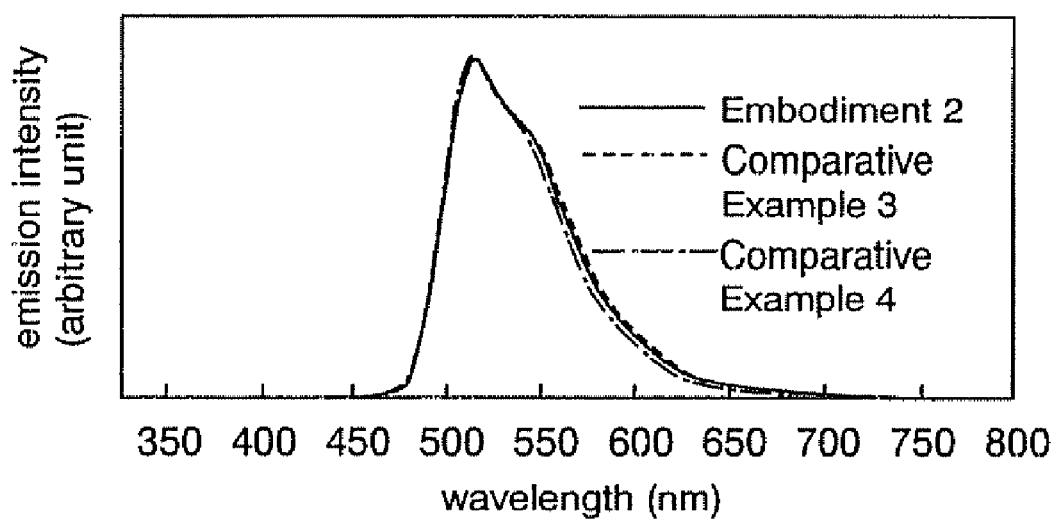
FIG. 14 illustrates Spectrum data of Embodiment 2, Comparative Example 3 and Comparative Example 4.
Figure 15:
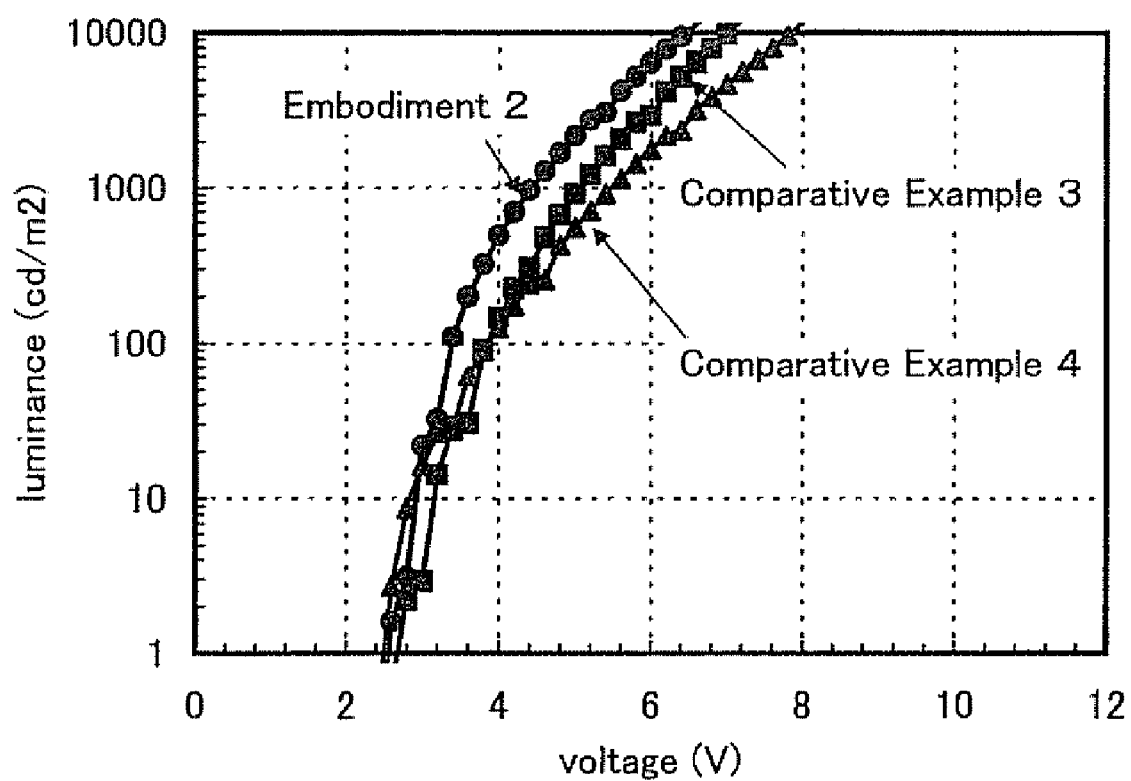
FIG. 15 illustrates Voltage-Luminance curves of Embodiment 2, Comparative Example 3 and Comparative Example 4.

Results of the measurement of the thin film light emitting element that is manufactured are shown in Table 2, FIG. 14 and FIG. 15. It is to be noted that current efficiency described in Table 2 is efficiency in the case of 1000 cd/m2.

TABLE 2

|  | chromaticity x | chromaticity y | efficiency (cd/A) |
|---|---|---|---|
| Embodiment 2 | 0.2845 | 0.6483 | 12.0141 |
| Comparative Example 3 | 0.2852 | 0.6467 | 9.2819 |
| Comparative Example 4 | 0.2707 | 0.6566 | 11.4489 |

Coumarine6 that is used as the luminescent substance 107 in Embodiment 2, Comparative Example 3 and Comparative Example 4 is a luminescent substance that emits green light, and it is estimated that coumarine6 has a larger energy gap since rubrene is an additive that emits yellow light. Here, according to the spectrum data of FIG. 14, it is appreciated that luminescence spectrums of Embodiment 2, Comparative Example 3 and Comparative Example 4 almost correspond to each other, and light is not emitted from rubrene that is an additive.

However, considering current efficiency of Table 2, current efficiency of Comparative Example 3 is lower as compared with Embodiment 2. It is understood that excitation energy is transferred from coumarine6 to rubrene that is an additive so that coumarine6 is deactivated and current efficiency is decreased.

Moreover, when Comparative example 4 in which rubrene is not added and Embodiment 2 in which rubrene is added are compared, it is appreciated that the same luminance is obtained at lower voltage in the light emitting element of Embodiment 2 and low voltage drive is also realized in the light emitting element of Embodiment 2 that has the structure of the present invention according to a graph of FIG. 15.

EMBODIMENT 3

In Embodiment 3, a thin film light emitting element is manufactured, in which an electron injecting layer is provided in addition to the structure in which a host material of the light emitting layer that is described in FIG. 1(B) and a host material of the first region and a material of the second region are common. Then, a measurement is conducted. In the present embodiment, ITSO as an anode 101 (a first electrode), DNTPD of 50 nm as a hole injecting layer 109, NPB of 10 nm as a hole transporting layer, Alq3 of 30 nm added with bis[2, 3-bis(4-fluorophenyl)quinoxalinate]iridium(acetylacetonate) (Abbreviation: Ir(Fdpd)2(acac)) as a luminescent substance 107 as a light emitting layer 103, Alq3 of 20 nm as a second region 104 that is an electron transportin layer 10, and Alq3 of 10 nm added with rubrene as additives 108 as a first region 105 are laminated. Further, CaF as an electron inject-ing layer and aluminum as a cathode 106 (second electrode) are laminated thereover to form a light emitting element.

Ir(Fdpd)2acac that is the luminescent substance 107 in the light emitting layer 103 is added at the ratio of 0.08 when the amount of Alq3 that is a host material of the light-emitting layer 103 is 1. In addition, rubrene that is the additive 108 in the first region of the electron transporting layer is added at the ratio of 1:1 with respect to the amount of Alq3 that is a host material of the electron transporting layer 10.

In addition, as to Comparative Example 5, instead of the first region and the second region in Embodiment 3, Alq3 of 20 nm not added with rubrene as an additive is formed as an electron transporting layer. The other structures are the same as in Embodiment 1.

Figure 16:
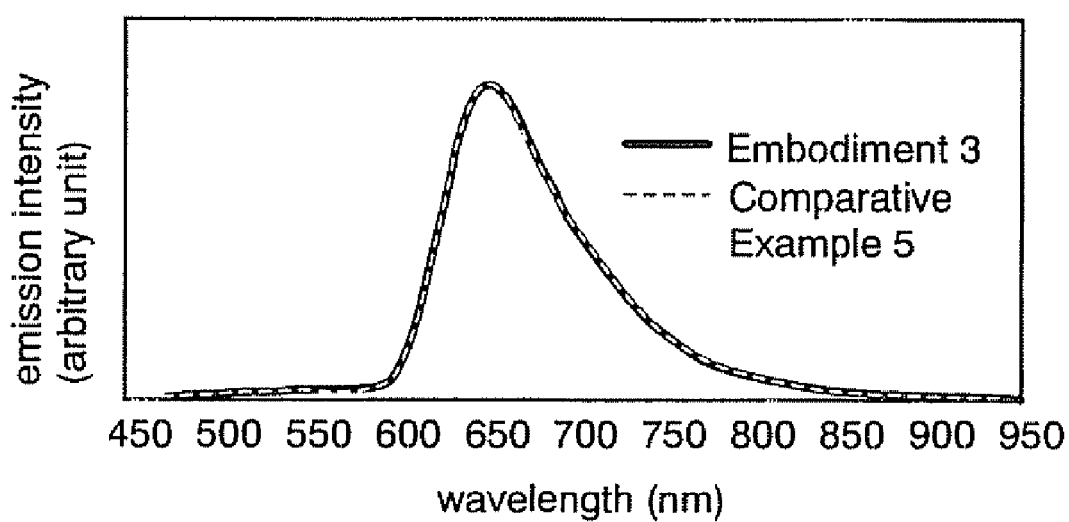
FIG. 16 illustrates Spectrum data of Embodiment 3 and Comparative Example 5.
Figure 17:
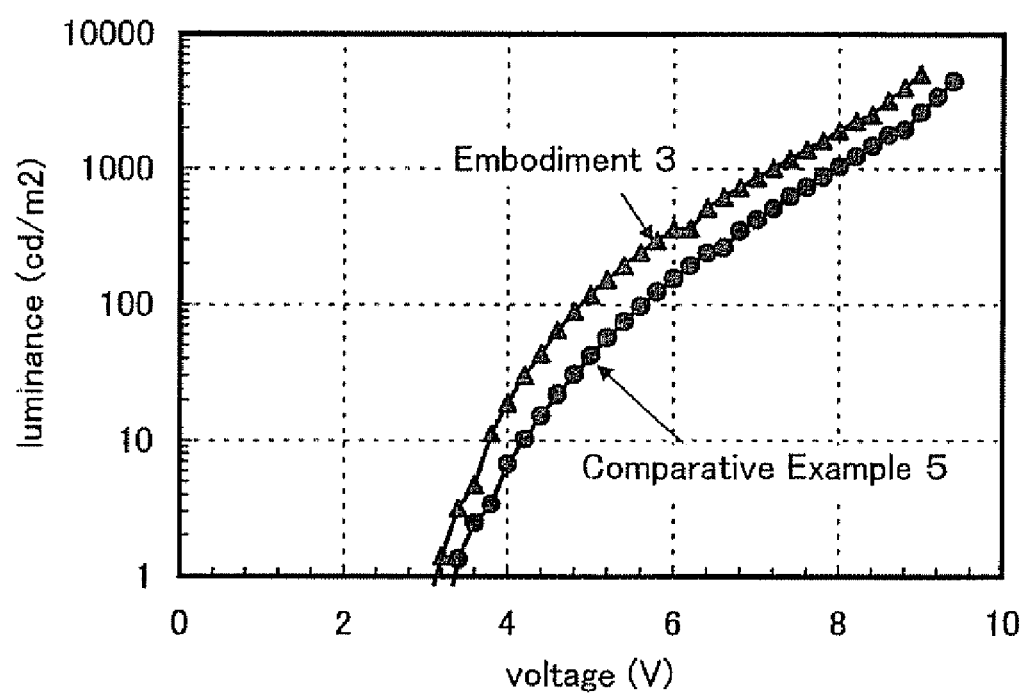
FIG. 17 illustrates Voltage-Luminance curves of Embodiment 3 and Comparative Example 5.

Results of the measurement of the thin film light emitting elements that are manufactured are shown in Table 3, FIG. 16 and FIG. 17. It is to be noted that current efficiency described in Table 3 is efficiency in the case of 500 cd/m2.

TABLE 3

|  | chromaticity x | chromaticity y | efficiency (cd/A) |
|---|---|---|---|
| Embodiment 3 | 0.6702 | 0.3199 | 1.3205 |
| Comparative Example 5 | 0.6608 | 0.3259 | 0.9233 |

Ir(Fdpd)2(acac) that is used as the luminescent substance 107 in Embodiment 3 and Comparative Example 5 is a luminescent substance that emits red light and has a smaller energy gap than that of rubrene that is an additive. However, Ir(Fdpd)2(acac) emits red light that is fluorescence; thus, luminescence is quenched by energy transfer when rubrene that is an additive exists in the vicinity. However, such quenching can be prevented by providing the second region into which rubrene is not added as in Embodiment 3. In Table 3, it is appreciated that quenching due to rubrene does not take place in the structure of Embodiment 3, also because current efficiency of Embodiment 3 not so lowered more than in Comparative Example 5 (in fact, increased).

FIG. 16 shows luminescence spectrum data of Embodiments 3 and Comparative Example 5. Luminescence spectrum of Embodiments 3 and Comparative Example 5 almost correspond to each other, and it is appreciated that light is not emitted from rubrene that is an additive.

FIG. 17 shows voltage-luminance curves of Embodiments 3 and 5. In the light emitting element of Embodiment 3, the same luminance is obtained at lower voltage as compared with Comparative Example 5, and thus, low voltage drive of the light emitting element of Embodiment 3 that has the structure according to the present invention is realized.

Ir(Fdpd)2acac that is used in the present embodiment is a novel material; therefore, synthesis example is shown as follows.

SYNTHESIS EXAMPLE 1

The present synthesis example shows bis[2,3-bis(4-fluorophenyl)quinoxalinato]acetylacetonate iridium (III) [Abbreviation: Ir(Fdpd)2(acac)] that is indicated by the following structural formula (1).

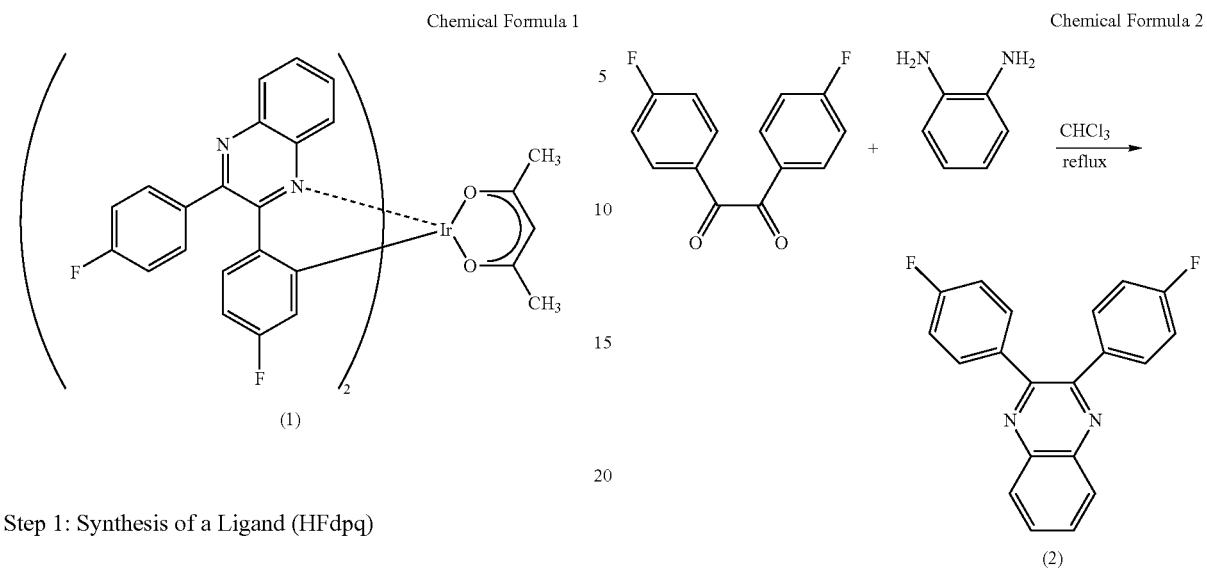

Step 1: Synthesis of a Ligand (HFdpq)

First, 4,4'difluorobenzil of 3.71 g and o-phenylenediamine of 1.71 g are heated and agitated in chloroform solvent of 200 mL for 6 hours. The reaction solution is back to a room temperature, cleaned by 1NHCl and saturated salt solution, and dried by magnesium sulfate. By evapolating the solvent, a ligand HFdpq [2,3-bis(4-fluorophenyl)quinoxaline] is obtained (light yellow powder, yield is 99%). A synthesis scheme and a structural formula of the lignad HFdpq are shown in the following formula (2).

Step 2: Synthesis of Binuclear Complex [Ir(Fdpq)2Cl]2

First, mixed solution of 2-ethoxyethanol of 30 ml and water of 10 ml is used as solvent, and a ligand HFdpq (2,3-bis(4-fluorophenyl)quinoxaline) of 3.61 g and iridium chloride (IrCl3.HCl.H2O) of 1.35 g are mixed and refluxed for 17 hours under a nitrogen atmosphere to obtain a binuclear complex [fr(Fdpq)2Cl]2 (brown powder, yield is 99%). A synthesis scheme and a structural formula of the binuclear complex [Ir(Fdpq)2Cl]2 are shown in the following formula (3).

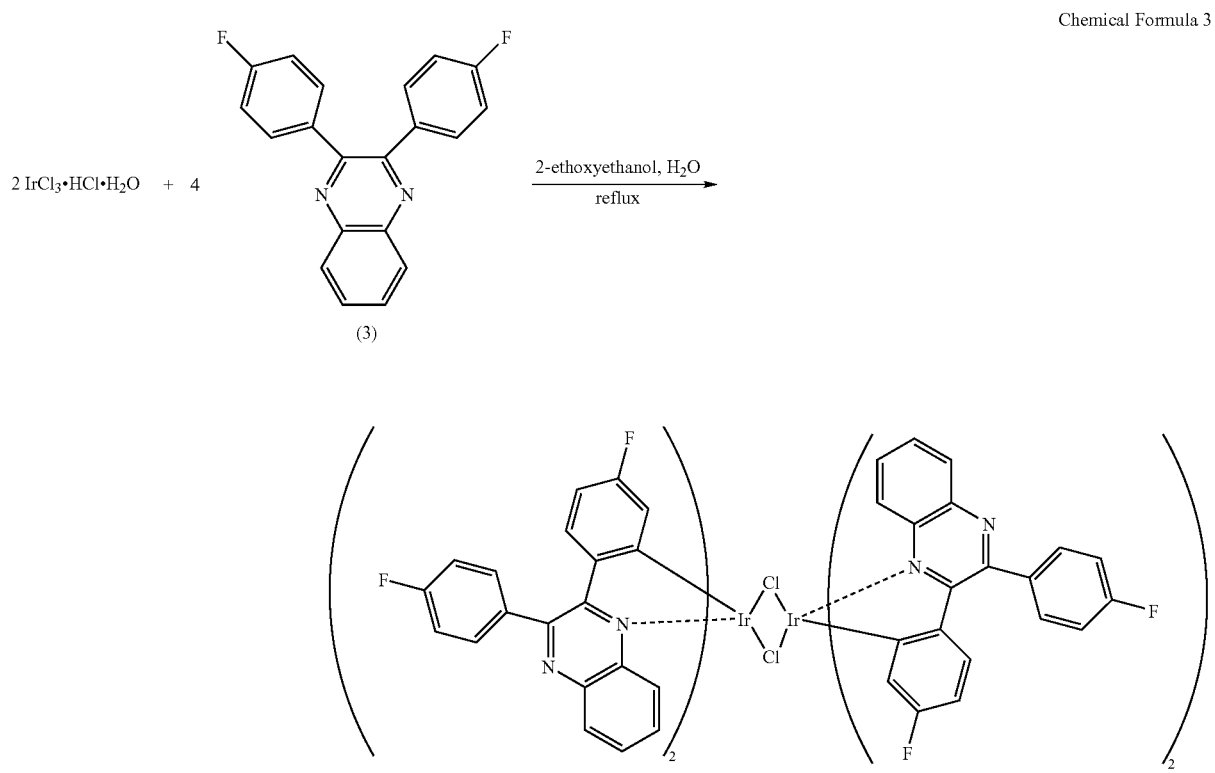

Step 3: Synthesis of an Organic Metal Complex Ir(Fdpq)2 (acac)

Further, 2-ethoxyethanol of 30 ml is used as solvent, and the binuclear complex [Ir(Fdpq)2Cl]2 of 2.00 g that is obtained in the step 2, acetylacetone (Hacac) of 0.44 ml and sodium carbonate of 1.23 g are mixed and refluxed for 20 hours under a nitrogen atmosphere to obtain an organic metal complex Ir(Fdpq)2(acac) of the present invention indicated by the structural formula(16) as described above (red powder, yeild is 44%). A synthesis scheme is shown in the following formula (4).

Chemical Formula 4

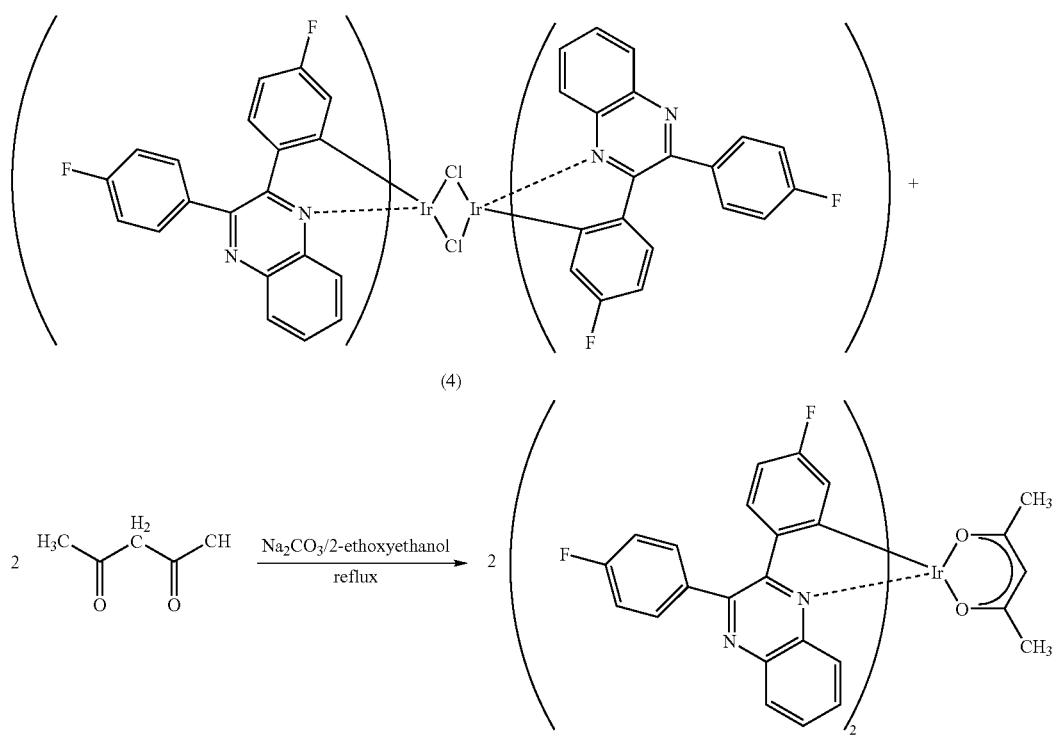

Ir(Fdpq)$_2$(acac) can be synthesized as described above.

The invention claimed is:

1. A light emitting element comprising, between electrodes, at least:
   a light emitting layer containing a luminescent substance; and
   an electron transporting layer formed over the light emitting layer, the electron transporting layer being divided into a first region and a second region,
   wherein the second region is provided between the light emitting layer and the first region,
   the first region is doped with a substance containing a polycyclic condensed ring,
   the second region is not doped with an additive, and
   wherein a compound that mainly forms the first region and a compound that forms the second region are the same compound.

2. The light emitting element according to claim 1, wherein the second region has a thickness of 5 nm or more.

3. The light emitting element according to claim 1, wherein the second region has a thickness of 10 nm or more.

4. The light emitting element according to claim 1, wherein a compound that mainly forms the first region, a compound that forms the second region and a compound that mainly forms the light emitting layer are the same compound.

5. The light emitting element according to claim 1, wherein the luminescent substance emits phosphorescence.

6. The light emitting element according to claim 1, wherein an energy gap of the substance containing the polycyclic condensed ring is smaller than an energy gap of the luminescent substance.

7. The light emitting element according to claim 1, wherein the substance containing the polycyclic condensed ring is one of rubrene, 9,10-diphenylanthracene, pentacene and perylene.

8. A display device comprising the light emitting element according to claim 1.

9. A TV set comprising the display device according to claim 8.

10. A light emitting element comprising, between an anode and a cathode, at least:
   a light emitting layer containing a luminescent substance; and
   an electron transporting layer formed over the light emitting layer, the electron transporting layer being divided into a first region and a second region,
   wherein the second region is provided between and in contact with the light emitting layer and the first region,
   the first region is doped with a substance containing a polycyclic condensed ring,
   the second region is not doped with an additive, and wherein a compound that mainly forms the first region and a compound that forms the second region are the same compound.

11. The light emitting element according to claim 10, wherein the second region has a thickness of 5 nm or more.

12. The light emitting element according to claim 10, wherein the second region has a thickness of 10 nm or more.

13. The light emitting element according to claim 10, wherein a compound that mainly forms the first region, a compound that forms the second region and a compound that mainly forms the light emitting layer are the same compound.

14. The light emitting element according to claim 10, wherein the luminescent substance emits phosphorescence.

15. The light emitting element according to claim 10, wherein an energy gap of the substance containing the polycyclic condensed ring is smaller than an energy gap of the luminescent substance.

16. The light emitting element according to claim 10, wherein the substance containing the polycyclic condensed ring is one of rubrene, 9,10-diphenylanthracene, pentacene and perylene.

17. A display device comprising the light emitting element according to claim 10.

18. A TV set comprising the display device according to claim 17.

19. A light emitting element comprising, between electrodes, at least:
  a light emitting layer containing a luminescent substance; and
  an electron transporting layer formed over the light emitting layer, the electron transporting layer being divided into a first region and a second region,
  wherein the second region is provided between the light emitting layer and the first region,
  the first region includes an electron transporting material,
  the second region is not doped with an additive,
  a substance containing a polycyclic condensed ring is added into the first region,
  wherein a compound that mainly forms the first region and a compound that forms the second region are the same compound.

20. The light emitting element according to claim 19, wherein the second region has a thickness of 5 nm or more.

21. The light emitting element according to claim 19, wherein the second region has a thickness of 10 nm or more.

22. The light emitting element according to claim 19, wherein a compound that mainly forms the first region, a compound that forms the second region and a compound that mainly forms the light emitting layer are the same compound.

23. The light emitting element according to claim 19, wherein the luminescent substance emits phosphorescence.

24. The light emitting element according to claim 19, wherein an energy gap of the substance containing the polycyclic condensed ring is smaller than an energy gap of the luminescent substance.

25. The light emitting element according to claim 19, wherein the substance containing the polycyclic condensed ring is one of rubrene, 9,10-diphenylanthracene, pentacene and perylene.

26. A display device comprising the light emitting element according to claim 19.

27. A TV set comprising the display device according to claim 26.

* * * * *